United States Patent
Chen et al.

(10) Patent No.: US 10,269,624 B2
(45) Date of Patent: Apr. 23, 2019

(54) CONTACT PLUGS AND METHODS OF FORMING SAME

(71) Applicant: Taiwan Semiconductor Manufacturing Company, Ltd., Hsinchu (TW)

(72) Inventors: Xi-Zong Chen, Tainan (TW); Y. H. Kuo, Hsinchu (TW); Cha-Hsin Chao, Taipei (TW); Yi-Wei Chiu, Kaohsiung (TW); Li-Te Hsu, Shanhua Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 15/801,154

(22) Filed: Nov. 1, 2017

(65) Prior Publication Data

US 2019/0035679 A1   Jan. 31, 2019

Related U.S. Application Data

(60) Provisional application No. 62/539,333, filed on Jul. 31, 2017.

(51) Int. Cl.
| | |
|---|---|
| *H01L 21/768* | (2006.01) |
| *H01L 21/033* | (2006.01) |
| *H01L 21/28* | (2006.01) |
| *H01L 23/538* | (2006.01) |
| *H01L 27/088* | (2006.01) |

(Continued)

(52) U.S. Cl.
CPC .... *H01L 21/76816* (2013.01); *H01L 21/0273* (2013.01); *H01L 21/0337* (2013.01);
(Continued)

(58) Field of Classification Search
CPC .......... H01L 21/76816; H01L 21/0273; H01L 21/76877; H01L 21/76802;
(Continued)

(56) References Cited

U.S. PATENT DOCUMENTS

| | | | |
|---|---|---|---|
| 5,374,849 A | 12/1994 | Tada | |
| 6,140,227 A * | 10/2000 | Chen ................ | H01L 21/76804 257/E21.578 |

(Continued)

FOREIGN PATENT DOCUMENTS

| | | |
|---|---|---|
| DE | 102004036156 A1 | 3/2006 |
| JP | 02069934 A | 3/1990 |

*Primary Examiner* — Bac H Au
(74) *Attorney, Agent, or Firm* — Slater Matsil, LLP

(57) ABSTRACT

An embodiment method includes patterning an opening through a dielectric layer, depositing an adhesion layer along sidewalls and a bottom surface of the opening, depositing a first mask layer in the opening over the adhesion layer, etching back the first mask layer below a top surface of the dielectric layer, and widening an upper portion of the opening after etching back the first mask layer. The first mask layer masks a bottom portion of the opening while widening the upper portion of the opening. The method further includes removing the first mask layer after widening the upper portion of the opening and after removing the first mask layer, forming a contact in the opening by depositing a conductive material in the opening over the adhesion layer.

20 Claims, 30 Drawing Sheets

(51) Int. Cl.
*H01L 29/417* (2006.01)
*H01L 21/027* (2006.01)

(52) U.S. Cl.
CPC .......... *H01L 21/28* (2013.01); *H01L 21/7688* (2013.01); *H01L 21/76802* (2013.01); *H01L 21/76804* (2013.01); *H01L 21/76831* (2013.01); *H01L 21/76843* (2013.01); *H01L 21/76865* (2013.01); *H01L 21/76877* (2013.01); *H01L 21/76897* (2013.01); *H01L 23/5386* (2013.01); *H01L 27/0886* (2013.01); *H01L 29/41791* (2013.01)

(58) Field of Classification Search
CPC ......... H01L 21/76843; H01L 21/76831; H01L 21/7688; H01L 21/76865; H01L 21/76804; H01L 29/41725
See application file for complete search history.

(56) References Cited

U.S. PATENT DOCUMENTS

| | | | |
|---|---|---|---|
| 7,615,489 B1 * | 11/2009 | Fu | H01L 21/2855 257/E21.575 |
| 8,507,344 B2 * | 8/2013 | Kim | H01L 21/7682 257/E21.008 |
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 * | 8/2015 | Wang | H01L 29/0684 |
| 9,236,267 B2 | 1/2016 | De et al. | |
| 9,236,300 B2 | 1/2016 | Liaw | |
| 9,306,032 B2 * | 4/2016 | Lin | H01L 29/66477 |
| 9,390,939 B2 * | 7/2016 | Xie | H01L 21/0214 |
| 9,496,225 B1 * | 11/2016 | Adusumilli | H01L 23/535 |
| 9,502,308 B1 * | 11/2016 | Park | H01L 21/823871 |
| 9,502,309 B1 * | 11/2016 | Cheng | H01L 21/823871 |
| 9,520,482 B1 | 12/2016 | Chang et al. | |
| 9,576,814 B2 | 2/2017 | Wu et al. | |
| 9,679,813 B2 * | 6/2017 | Chen | H01L 21/76805 |
| 9,691,658 B1 * | 6/2017 | Alptekin | H01L 21/76843 |
| 9,876,094 B2 * | 1/2018 | Bae | H01L 29/665 |
| 2015/0179567 A1 * | 6/2015 | Govindaraju | H01L 23/5226 257/758 |
| 2016/0225715 A1 * | 8/2016 | St. Amour | H01L 29/7833 |
| 2016/0315045 A1 * | 10/2016 | Baek | H01L 23/5283 |

* cited by examiner

CONTACT PLUGS AND METHODS OF FORMING SAME

PRIORITY CLAIM AND CROSS-REFERENCE

This patent application claims priority to U.S. Provisional Application No. 62/539,333, filed on Jul. 31, 2017 and entitled "Contact Plugs and Methods of Forming Same," which application is hereby incorporated by reference herein as if reproduced in its entirety.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
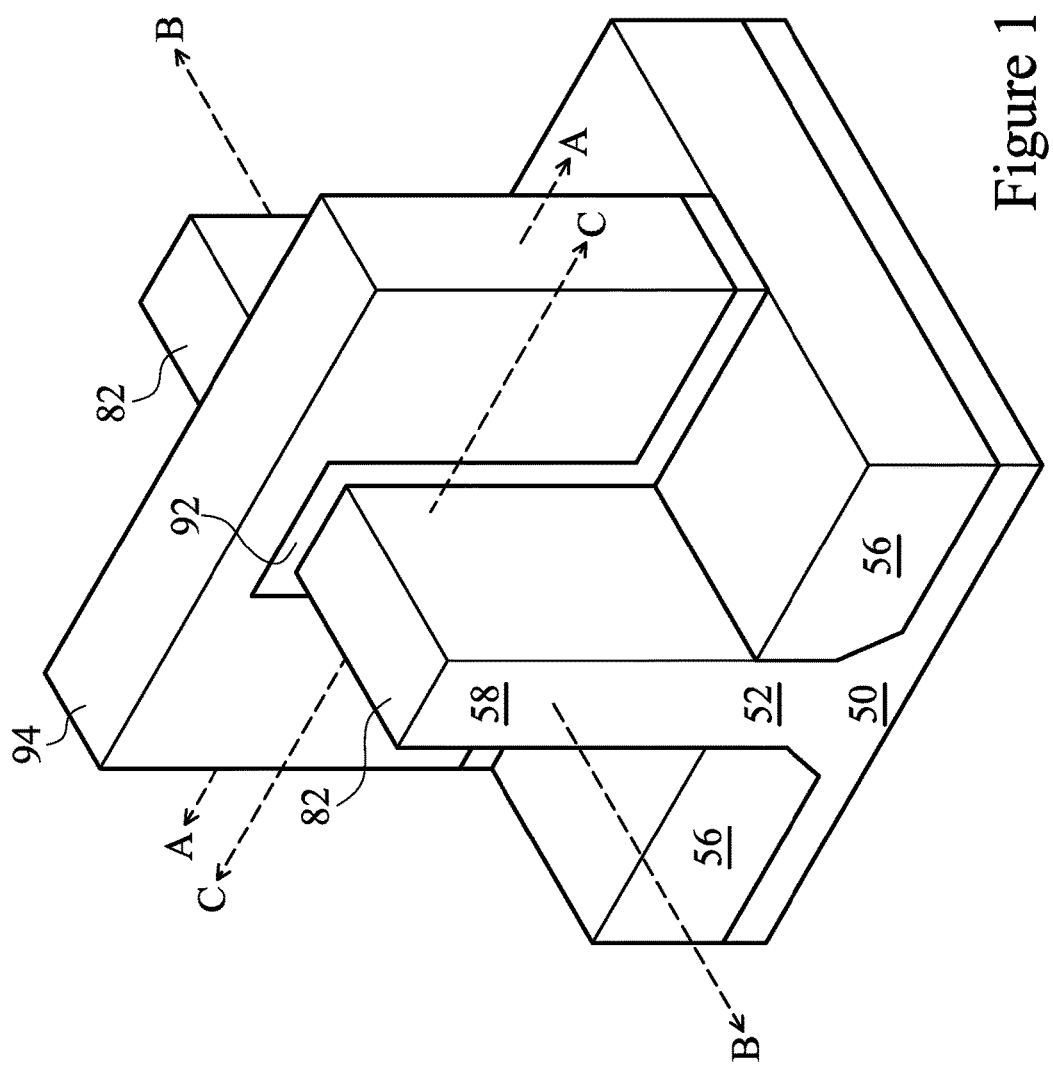
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide processes for forming contact plugs with improved gap filling. For example, an opening may be patterned in a dielectric layer to expose an underlying feature (e.g., a source/drain region or metal gate of a transistor). Upper portions of the opening may be expanded in order to increase the process window for filling a conductive material into the opening. In some embodiments, the conductive material is cobalt, which advantageously provides lower resistance than other contact materials (e.g., tungsten). The widened upper portions of the opening allows for the conductive material to be filled with fewer defects, such as undesired voids.

In some embodiments, an adhesion layer is deposited in the opening prior to depositing the conductive material. The adhesion layer improves the adhesion between the conductive material and the dielectric layer. A mask layer may be deposited over the adhesion layer in the opening, and the mask layer may be etched back to expose upper portions of the adhesion layer while the opening is widened. Widening the opening may advantageously provide a larger process window for forming contacts in the opening with fewer defects (e.g., voids). In some embodiments, the mask layer protects bottom portions of the adhesion layer while the upper portions of the opening are widened. In some embodiments, the mask layer may be repeatedly deposited and etched back prior to widening the opening in order to mitigate a pattern loading effect caused by different pattern densities of a device during processing. Thus, various embodiments provide manufacturing methods and resulting structures for contact plugs with fewer defects, reduced resistance, and increased yield.

Various embodiments are discussed herein in a particular context, namely, forming source/drain contacts, which are electrically connected to source/drain regions of a finFET transistor. However, various embodiments may be applied to other semiconductor devices/processes, such as gate contacts of finFET transistors, gate and/or source/drain contacts of planar transistors, interconnect structures, and the like. Furthermore, the repeated deposition and etch back processes discussed herein may be used in any gap-filling application where pattern loading is a concern (e.g., deposition of a reverse material in patterning processes).

FIG. 1 illustrates an example of a FinFET in a three-dimensional view, in accordance with some embodiments. The FinFET comprises a fin 58 on a substrate 50 (e.g., a semiconductor substrate). Isolation regions 56 are disposed in the substrate 50, and the fin 58 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. A gate dielectric layer 92 is along sidewalls and over a top surface of the fin 58, and a gate electrode 94 is over the gate dielectric layer 92. Source/drain regions 82 are disposed in opposite sides of the fin 58 with respect to the gate dielectric layer 92 and gate electrode 94. FIG. 1 further illustrates reference cross-sections that are used in later figures. Cross-section A-A is along a longitudinal axis of the gate electrode 94 and in a direction, for example perpendicular to the direction of current flow between the source/drain regions 82 of the FinFET. Cross-section B-B is perpendicular to cross-section A-A and is along a longitudinal axis of the fin 58 and in a direction of, for example, a current flow between the source/drain regions 82 of the FinFET. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

FIGS. 2 through 16B are cross-sectional views of intermediate stages in the manufacturing of FinFETs, in accordance with some embodiments. FIGS. 2 through 7 illustrate reference cross-section A-A illustrated in FIG. 1, except for multiple fins/FinFETs. In FIGS. 8A through 16B, figures ending with an "A" designation are illustrated along reference cross-section A-A illustrated in FIG. 1, and figures ending with a "B" designation are illustrated along a similar cross-section B-B illustrated in FIG. 1, except for multiple fins/FinFETs. FIGS. 10C and 10D are illustrated along reference cross-section C-C illustrated in FIG. 1, except for multiple fins/FinFETs. FIGS. 17 through 29 are illustrated along reference cross-section B-B illustrated in FIG. 1.

Figure 2:
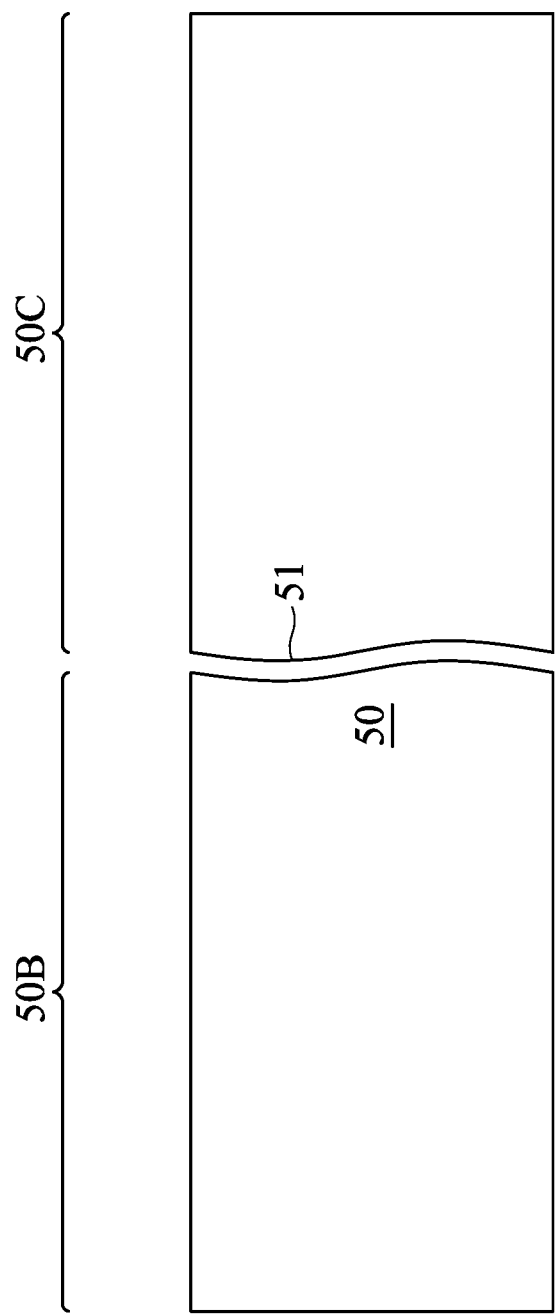
FIGS. 2, 3, 4, 5, 6, 7, 8A, 8B, 9A, 9B, 10A, 10B, 10C, 10D, 11A, 11B, 12A, 12B, 13A, 13B, 14A, 14B, 15A, 15B, 16A, and 16B are cross-sectional views of intermediate stages in the manufacturing of FinFETs, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 has a region 50B and a region 50C. The region 50B can be for forming n-type devices, such as NMOS transistors, e.g., n-type FinFETs. The region 50C can be for forming p-type devices, such as PMOS transistors, e.g., p-type FinFETs. The region 50B may be physically separated from the region 50C (as illustrated by divider 51), and any number of device features (e.g., other active devices, doped regions, isolation structures, etc.) may be disposed between the region 50B and the region 50C. In some embodiments, both the region 50B and the region 50C are used to form the same type of devices, such as both regions being for n-type devices or p-type devices.

Figure 3:
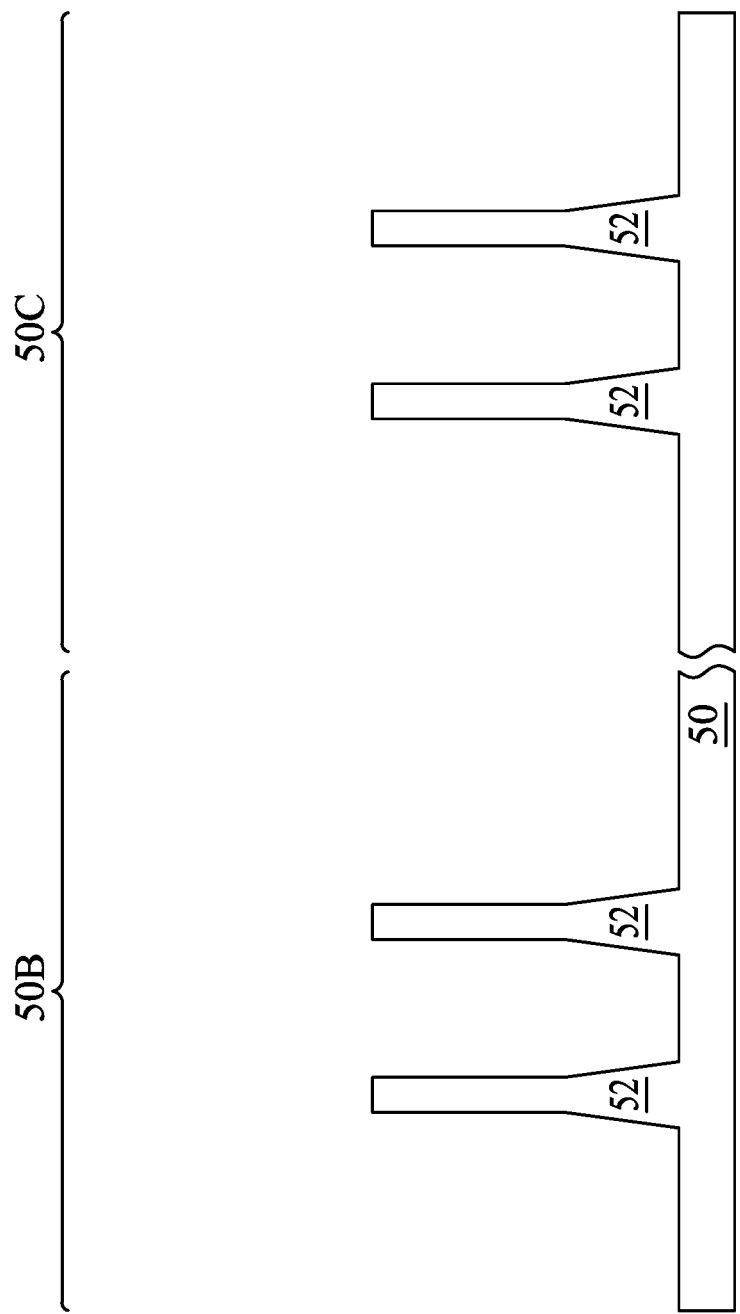

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Figure 4:
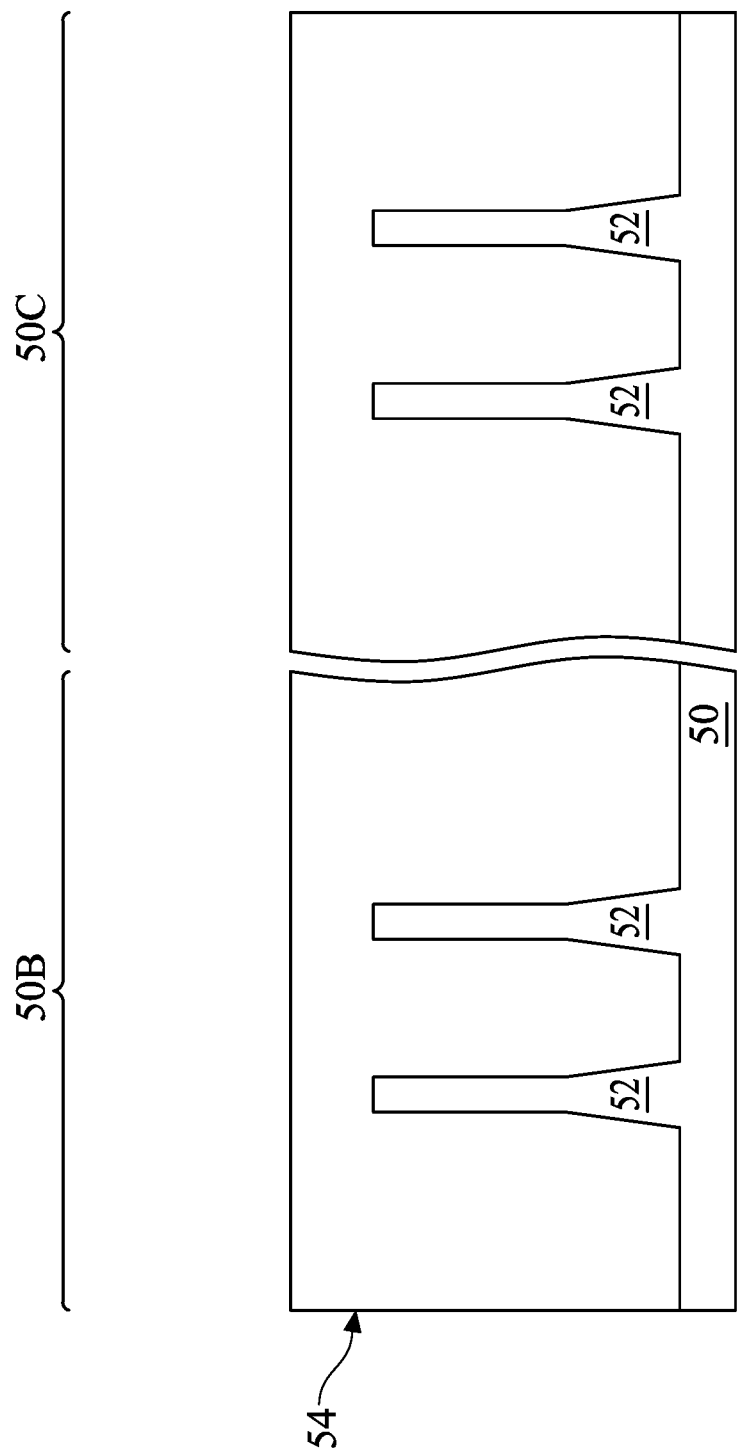

In FIG. 4, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52.

Figure 5:
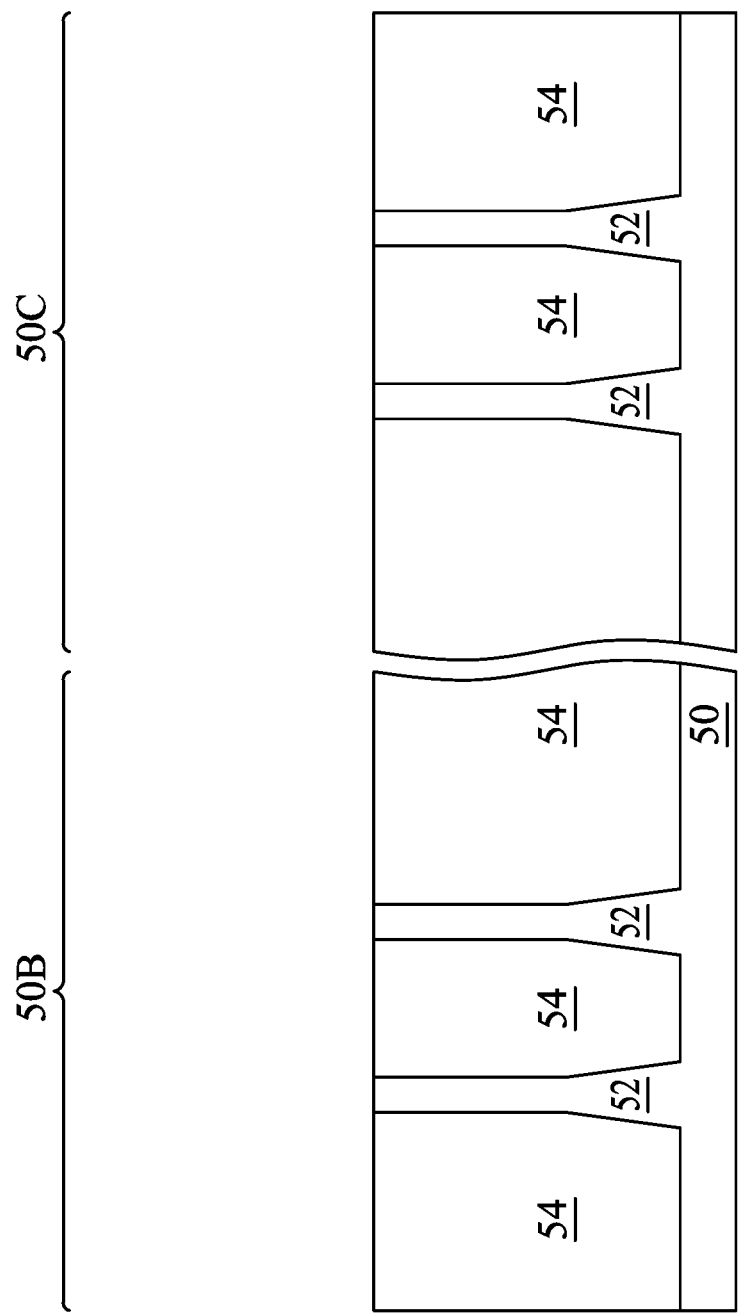

In FIG. 5, a planarization process is applied to the insulation material 54. In some embodiments, the planarization process includes a chemical mechanical polish (CMP), an etch back process, combinations thereof, or the like. The planarization process exposes the fins 52. Top surfaces of the fins 52 and the insulation material 54 are level after the planarization process is complete.

Figure 6:
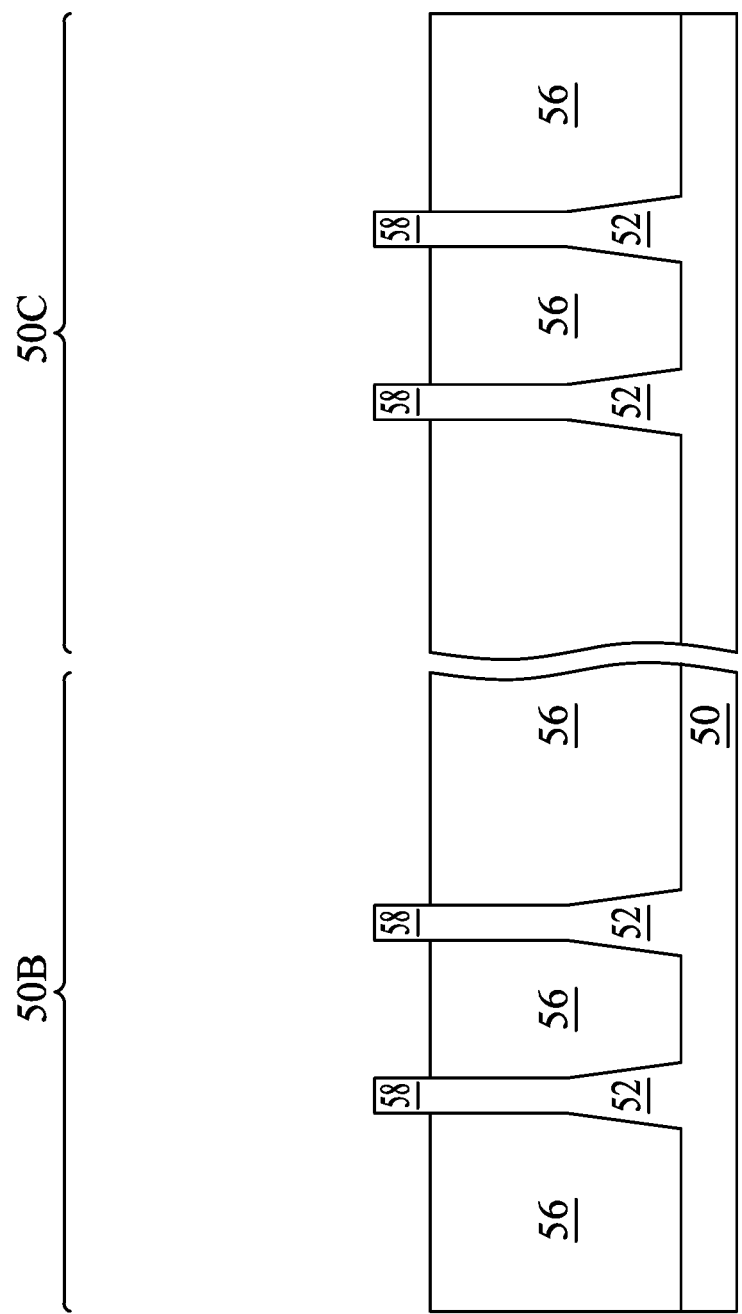

In FIG. 6, the insulation material 54 is recessed to form Shallow Trench Isolation (STI) regions 56. The insulation material 54 is recessed such that fins 58 in the region 50B and in the region 50C protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54. For example, a chemical oxide removal using a CERTAS® etch or an Applied Materials SICONI tool or dilute hydrofluoric (dHF) acid may be used.

A person having ordinary skill in the art will readily understand that the process described with respect to FIGS. 2 through 6 is just one example of how the fins 58 may be formed. In some embodiments, a dielectric layer can be formed over a top surface of the substrate 50; trenches can be etched through the dielectric layer; homoepitaxial structures can be epitaxially grown in the trenches; and the dielectric layer can be recessed such that the homoepitaxial structures protrude from the dielectric layer to form fins. In some embodiments, heteroepitaxial structures can be used for the fins 52. For example, the fins 52 in FIG. 5 can be recessed, and a material different from the fins 52 may be epitaxially grown in their place. In an even further embodiment, a dielectric layer can be formed over a top surface of the substrate 50; trenches can be etched through the dielectric layer; heteroepitaxial structures can be epitaxially grown in the trenches using a material different from the substrate 50; and the dielectric layer can be recessed such that the heteroepitaxial structures protrude from the dielectric layer to form the fins 58. In some embodiments where homoepitaxial or heteroepitaxial structures are epitaxially grown, the grown materials may be in situ doped during growth, which may obviate prior and subsequent implantations although in situ and implantation doping may be used together. Still further, it may be advantageous to epitaxially grow a material in an NMOS region different from the material in a PMOS region. In various embodiments, the fins 58 may be formed from silicon germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Further in FIG. 6, appropriate wells (not shown) may be formed in the fins 58, the fins 52, and/or the substrate 50. In some embodiments, a P well may be formed in the region 50B, and an N well may be formed in the region 50C. In some embodiments, a P well or an N well are formed in both the region 50B and the region 50C.

In the embodiments with different well types, the different implant steps for the region 50B and the region 50C may be achieved using a photoresist or other masks (not shown). For example, a photoresist may be formed over the fins 58 and the STI regions 56 in the region 50B. The photoresist is patterned to expose the region 50C of the substrate 50, such as a PMOS region. The photoresist can be formed by using a spin-on technique and can be patterned using acceptable photolithography techniques. Once the photoresist is patterned, an n-type impurity implant is performed in the region 50C, and the photoresist may act as a mask to substantially prevent n-type impurities from being implanted into the region 50B, such as an NMOS region. The n-type impurities may be phosphorus, arsenic, or the like implanted in the region to a concentration of equal to or less than $10^{18}$ cm$^{-3}$, such as between about $10^{17}$ cm$^{-3}$ and about $10^{18}$ cm$^{-3}$. After the implant, the photoresist is removed, such as by an acceptable ashing process.

Following the implanting of the region 50C, a photoresist is formed over the fins 58 and the STI regions 56 in the region 50C. The photoresist is patterned to expose the region 50B of the substrate 50, such as the NMOS region. The photoresist can be formed by using a spin-on technique and can be patterned using acceptable photolithography techniques. Once the photoresist is patterned, a p-type impurity implant may be performed in the region 50B, and the photoresist may act as a mask to substantially prevent p-type impurities from being implanted into the region 50C, such as the PMOS region. The p-type impurities may be boron, BF$_2$, or the like implanted in the region to a concentration of equal to or less than $10^{18}$ cm$^{-3}$, such as between about $10^{17}$ cm$^{-3}$ and about $10^{18}$ cm$^{-3}$. After the implant, the photoresist may be removed, such as by an acceptable ashing process.

After the implants of the region 50B and the region 50C, an anneal may be performed to activate the p-type and/or n-type impurities that were implanted. In some embodiments, the grown materials of epitaxial fins may be in situ doped during growth, which may obviate the implantations, although in situ and implantation doping may be used together.

Figure 7:
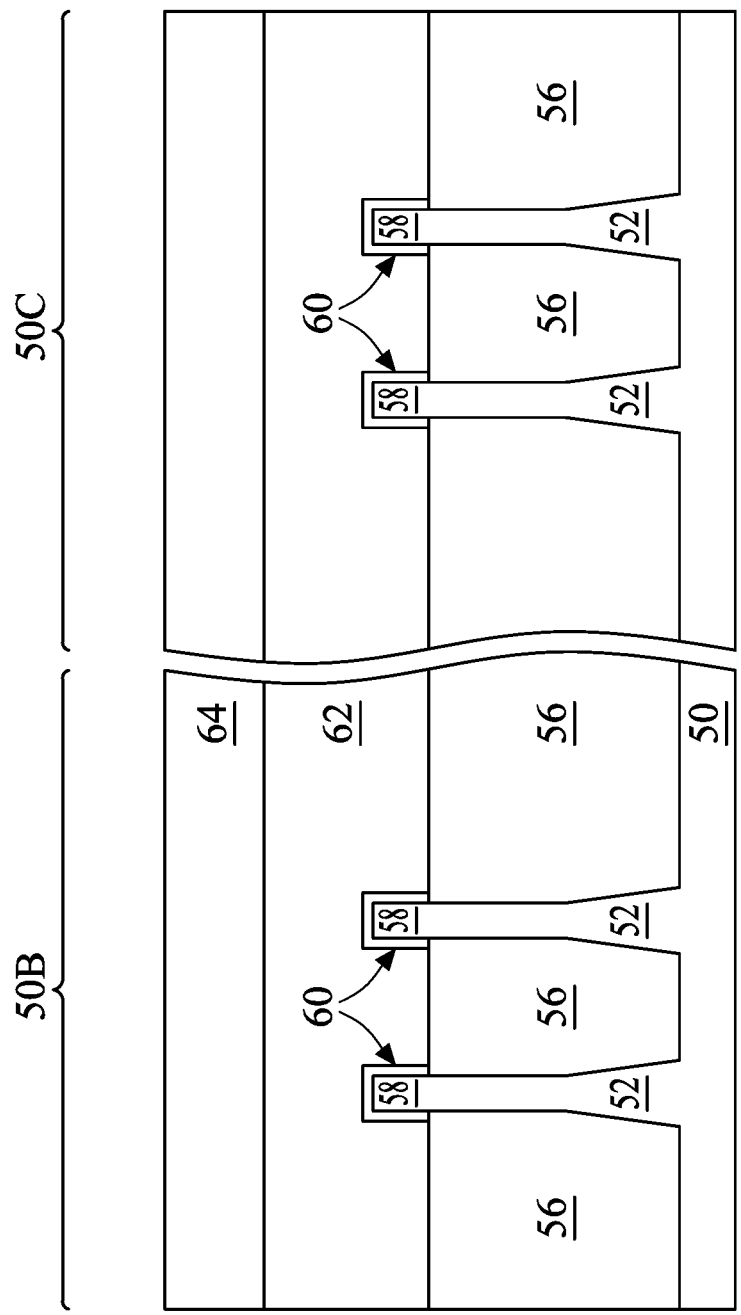

In FIG. 7, a dummy dielectric layer 60 is formed on the fins 58. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive material and may be selected from a group including polycrystalline-silicon (polysilicon), poly-crystalline silicon-germanium (poly-SiGe), metallic nitrides, metallic silicides, metallic oxides, and metals. In one embodiment, amorphous silicon is deposited and recrystallized to create polysilicon. The dummy gate layer 62 may be deposited by physical vapor deposition (PVD), CVD, sputter deposition, or other techniques known and used in the art for depositing conductive materials. The dummy gate layer 62 may be made of other materials that have a high etching selectivity from the etching of isolation regions. The mask layer 64 may include, for example, SiN, SiON, or the like. In this example, a single dummy gate layer 62 and a single mask layer 64 are formed across the region 50B and the region 50C. In some embodiments, separate dummy gate layers may be formed in the region 50B and the region 50C, and separate mask layers may be formed in the region 50B and the region 50C.

FIGS. 8A through 16B illustrate various additional steps in the manufacturing of embodiment devices. FIGS. 8A through 16B illustrate features in either of the region 50B and the region 50C. For example, the structures illustrated in FIGS. 8A through 16B may be applicable to both the region 50B and the region 50C. Differences (if any) in the structures of the region 50B and the region 50C are described in the text accompanying each figure.

Figure 8B:
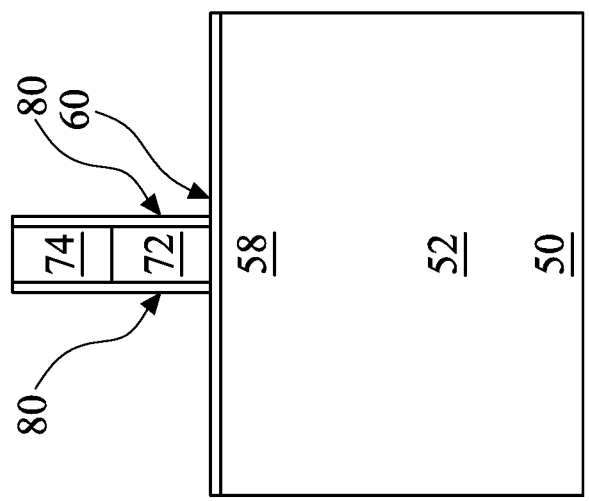
Figure 8A:
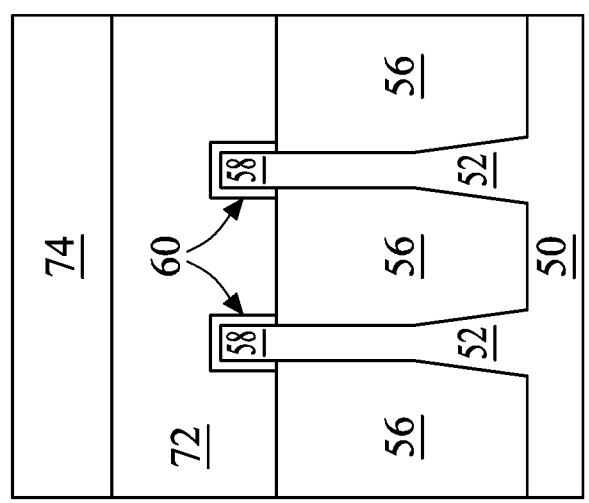

In FIGS. 8A and 8B, the mask layer 64 may be patterned using acceptable photolithography and etching techniques to form masks 74. The pattern of the masks 74 then may be transferred to the dummy gate layer 62 and the dummy dielectric layer 60 by an acceptable etching technique to form dummy gates 72. The dummy gates 72 cover respective channel regions of the fins 58. The pattern of the masks 74 may be used to physically separate each of the dummy gates 72 from adjacent dummy gates. The dummy gates 72 may also have a lengthwise direction substantially perpendicular to the lengthwise direction of respective epitaxial fins 52/58.

Further in FIGS. 8A and 8B, gate seal spacers 80 can be formed on exposed surfaces of the dummy gates 72, the masks 74, and/or the fins 58. A thermal oxidation or a deposition followed by an anisotropic etch may form the gate seal spacers 80.

After the formation of the gate seal spacers 80, implants for lightly doped source/drain (LDD) regions (not explicitly illustrated) may be performed. In the embodiments with different device types, similar to the implants discussed above in FIG. 6, a mask, such as a photoresist, may be formed over the region 50B, while exposing the region 50C, and appropriate type (e.g., n-type or p-type) impurities may be implanted into the exposed fins 58 in the region 50C. The mask may then be removed. Subsequently, a mask, such as a photoresist, may be formed over the region 50C while exposing the region 50B, and appropriate type impurities may be implanted into the exposed fins 58 in the region 50B. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{16}$ cm$^{-3}$. An anneal may be used to activate the implanted impurities.

Figure 9B:
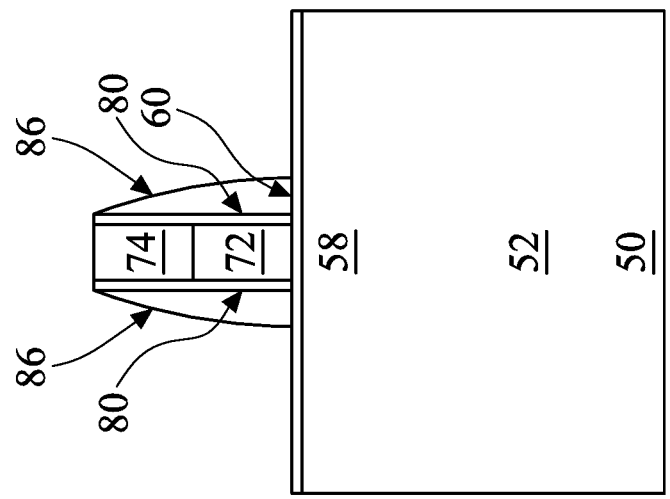
Figure 9A:
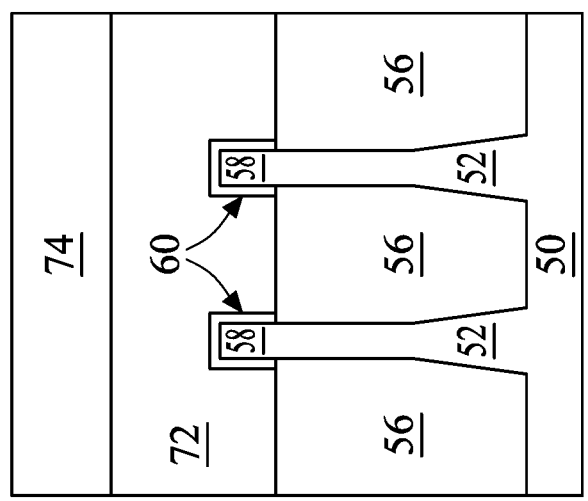

In FIGS. 9A and 9B, gate spacers 86 are formed on the gate seal spacers 80 along sidewalls of the dummy gates 72 and the masks 74. The gate spacers 86 may be formed by conformally depositing a material and subsequently anisotropically etching the material. The material of the gate spacers 86 may be silicon nitride, SiCN, a combination thereof, or the like.

Figure 10B:
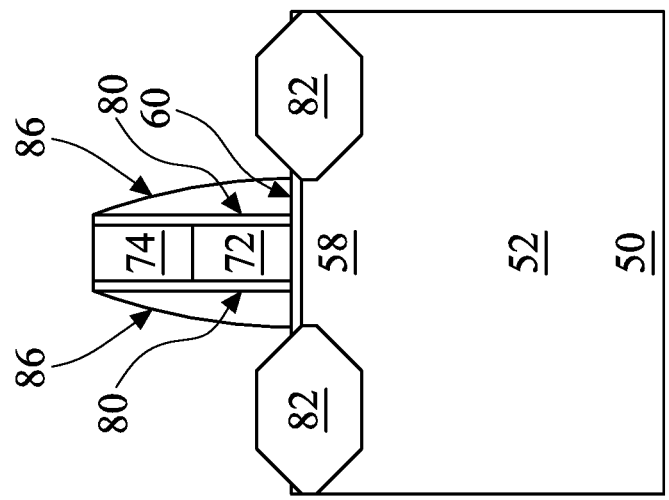
Figure 10A:
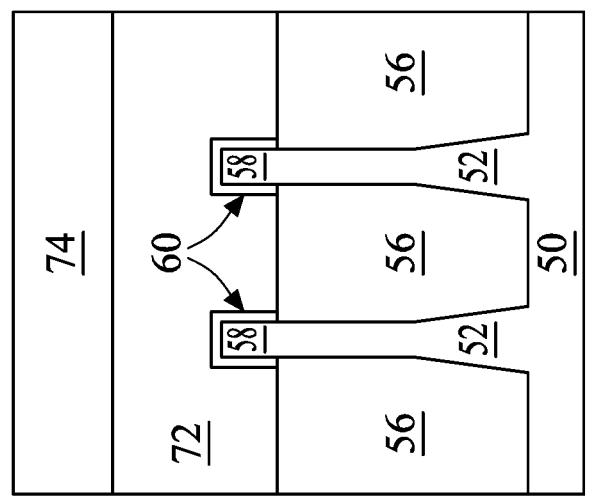
Figure 10C:
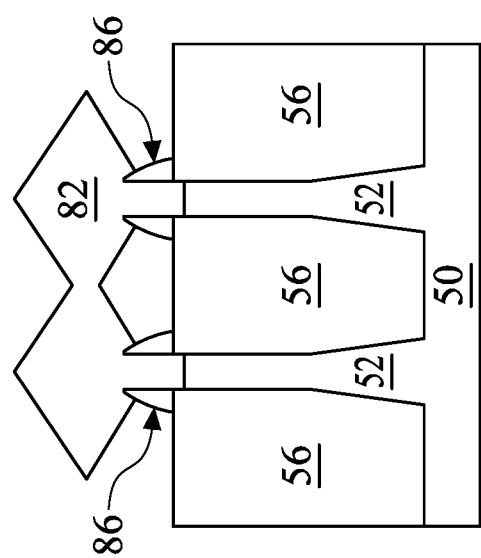
Figure 10D:
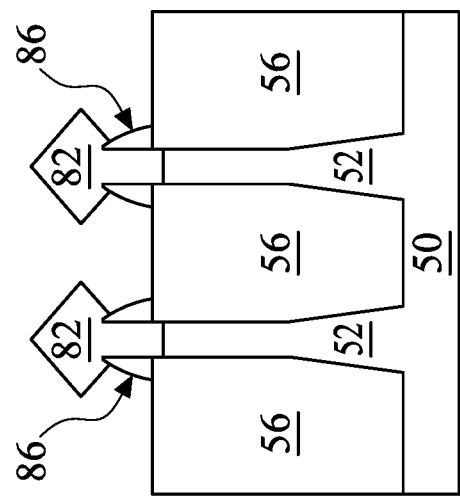

In FIGS. 10A and 10B epitaxial source/drain regions 82 are formed in the fins 58. The epitaxial source/drain regions 82 are formed in the fins 58 such that each dummy gate 72 is disposed between respective neighboring pairs of the epitaxial source/drain regions 82. In some embodiments that epitaxial source/drain regions 82 may extend into the fins 52. In some embodiments, the gate spacers 86 are used to separate the epitaxial source/drain regions 82 from the dummy gates 72 by an appropriate lateral distance so that the epitaxial source/drain regions 82 do not short out subsequently formed gates of the resulting FinFETs.

The epitaxial source/drain regions 82 in the region 50B, e.g., the NMOS region, may be formed by masking the region 50C, e.g., the PMOS region, and etching source/drain regions of the fins 58 in the region 50B form recesses in the fins 58. Then, the epitaxial source/drain regions 82 in the region 50B are epitaxially grown in the recesses. The epitaxial source/drain regions 82 may include any acceptable material, such as appropriate for n-type FinFETs. For example, if the fin 58 is silicon, the epitaxial source/drain regions 82 in the region 50B may include silicon, SiC, SiCP, SiP, or the like. The epitaxial source/drain regions 82 in the region 50B may have surfaces raised from respective surfaces of the fins 58 and may have facets.

The epitaxial source/drain regions 82 in the region 50C, e.g., the PMOS region, may be formed by masking the region 50B, e.g., the NMOS region, and etching source/drain regions of the fins 58 in the region 50C are etched to form recesses in the fins 58. Then, the epitaxial source/drain regions 82 in the region 50C are epitaxially grown in the recesses. The epitaxial source/drain regions 82 may include any acceptable material, such as appropriate for p-type FinFETs. For example, if the fin 58 is silicon, the epitaxial source/drain regions 82 in the region 50C may comprise SiGe, SiGeB, Ge, GeSn, or the like. The epitaxial source/drain regions 82 in the region 50C may also have surfaces raised from respective surfaces of the fins 58 and may have facets.

The epitaxial source/drain regions 82 and/or the fins 58 may be implanted with dopants to form source/drain regions, similar to the process previously discussed for forming lightly doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 82 may be in situ doped during growth.

As a result of the epitaxy processes used to form the epitaxial source/drain regions 82 in the region 50B and the region 50C, upper surfaces of the epitaxial source/drain regions have facets which expand laterally outward beyond a sidewalls of the fins 58. In some embodiments, these facets cause adjacent source/drain regions 82 of a same finFET to merge as illustrated by FIG. 10C. In other embodiments, adjacent source/drain regions 82 remain separated after the epitaxy process is completed as illustrated by FIG. 10D.

Figure 11B:
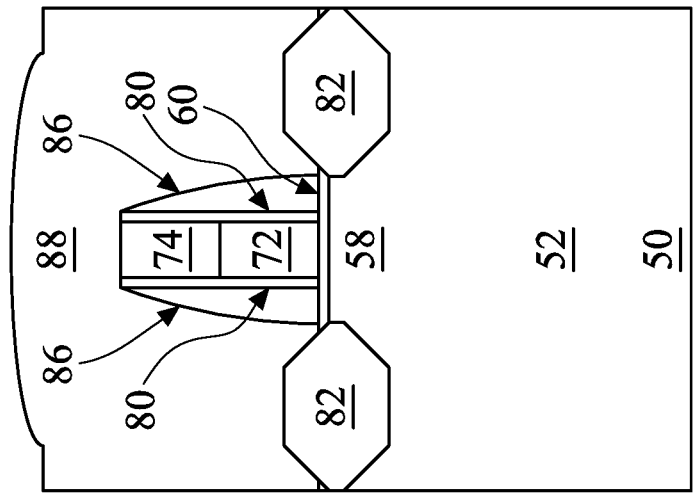
Figure 11A:
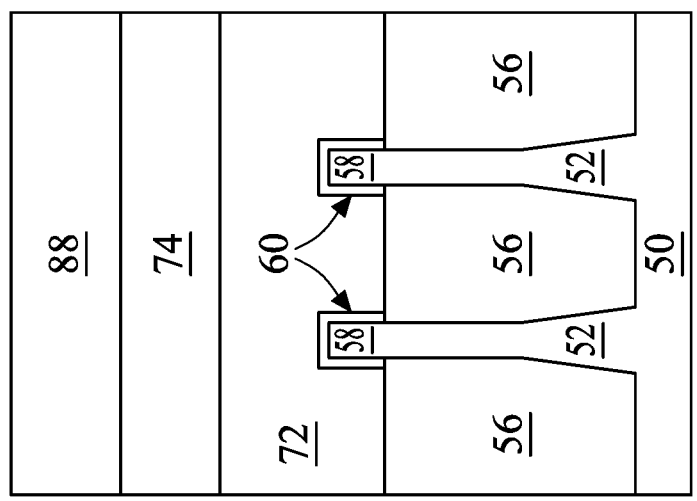

In FIGS. 11A and 11B, an ILD 88 is deposited over the structure illustrated in FIGS. 10A and 10B. The ILD 88 may be formed of a dielectric material or a semiconductor material, and may be deposited by any suitable method, such as CVD, plasma-enhanced CVD (PECVD), or FCVD. Dielectric materials may include Phospho-Silicate Glass (PSG), Boro-Silicate Glass (BSG), Boron-Doped Phospho-Silicate Glass (BPSG), undoped Silicate Glass (USG), or the like. Semiconductor materials may include amorphous silicon, silicon germanium ($Si_xGe_{1-x}$, where x can be between approximately 0 and 1), pure Germanium, or the like. Other insulation or semiconductor materials formed by any acceptable process may be used. In some embodiments, a contact etch stop layer (CESL), not illustrated, is disposed between the ILD 88 and the epitaxial source/drain regions 82, the hard mask 74, and the gate spacers 86.

Figure 12B:
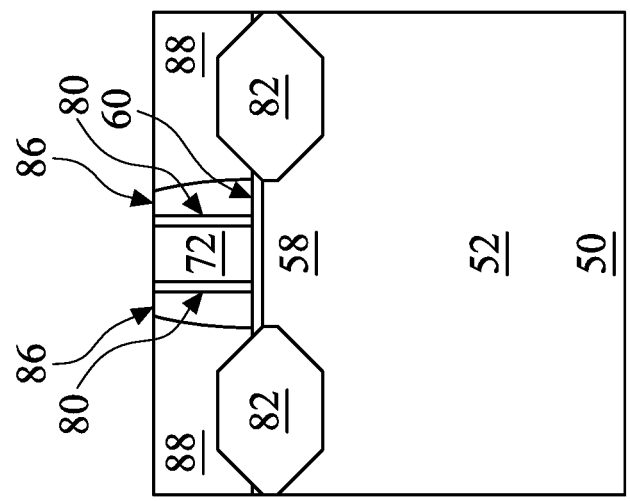
Figure 12A:
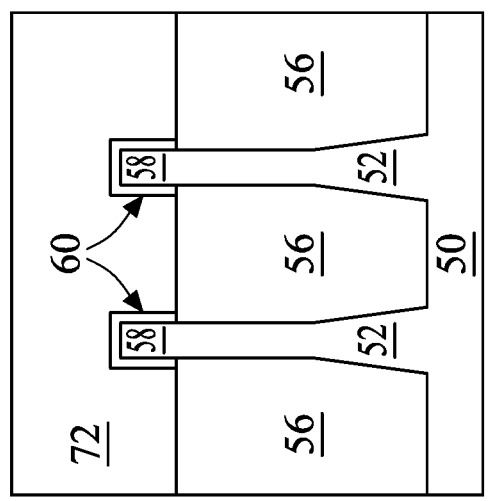

In FIGS. 12A and 12B, a planarization process, such as a CMP, may be performed to level the top surface of the ILD 88 with the top surfaces of the dummy gates 72. In an embodiment, the planarization process is performed using the planarization system 200. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the ILD 88 are level. Accordingly, the top surfaces of the dummy gates 72 are exposed through the ILD 88.

Figure 13B:
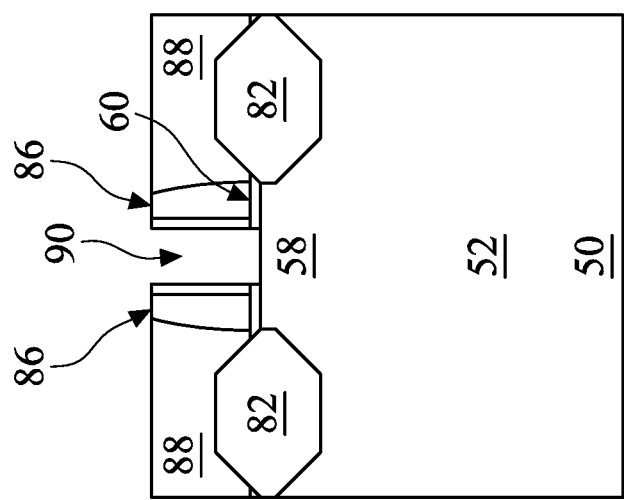
Figure 13A:
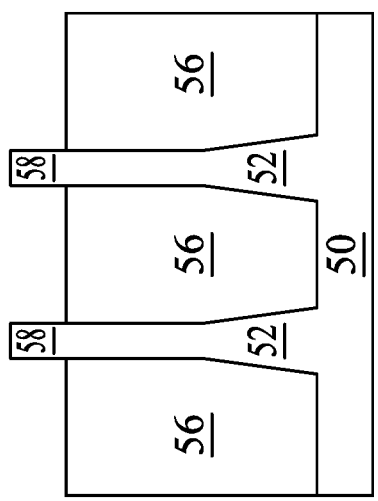

In FIGS. 13A and 13B, the dummy gates 72 and portions of the dummy dielectric layer 60 directly underlying the exposed dummy gates 72 are removed in an etching step(s), so that recesses 90 are formed. In some embodiments, the dummy gates 72 are removed by an anisotropic dry etch process. For example, the etching process may include a dry etch process using reaction gas(es) that selectively etch the dummy gates 72 without etching the ILD 88 or the gate spacers 86. Each recess 90 exposes a channel region of a respective fin 58. Each channel region is disposed between neighboring pairs of the epitaxial source/drain regions 82. During the removal, the dummy dielectric layer 60 may be used as an etch stop layer when the dummy gates 72 are etched. The dummy dielectric layer 60 may then be removed after the removal of the dummy gates 72.

Figure 14B:
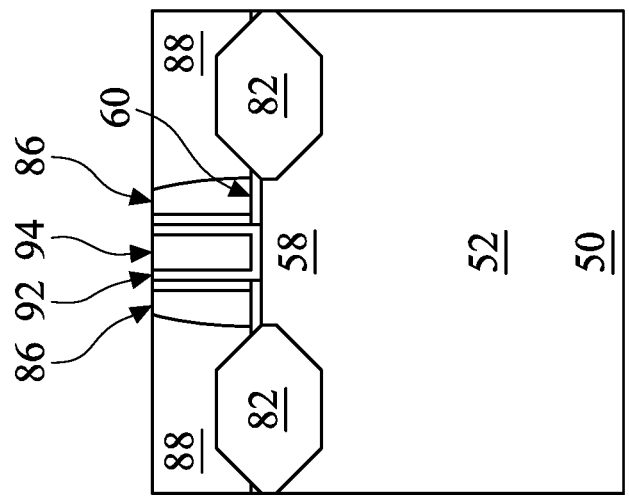
Figure 14A:
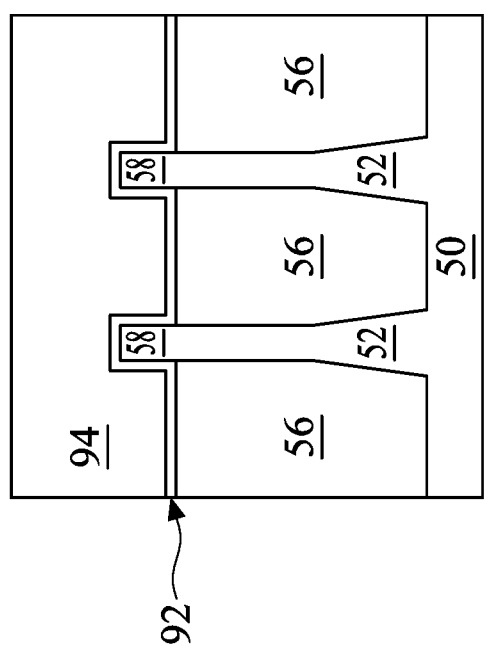

In FIGS. 14A and 14B, gate dielectric layers 92 and gate electrodes 94 are formed for replacement gates. Gate dielectric layers 92 are deposited conformally in the recesses 90, such as on the top surfaces and the sidewalls of the fins 58 and on sidewalls of the gate seal spacers 80/gate spacers 86. The gate dielectric layers 92 may also be formed on top surface of the ILD 88. In accordance with some embodiments, the gate dielectric layers 92 comprise silicon oxide, silicon nitride, or multilayers thereof. In some embodiments, the gate dielectric layers 92 are a high-k dielectric material, and in these embodiments, the gate dielectric layers 92 may have a k value greater than about 7.0, and may include a metal oxide or a silicate of Hf, Al, Zr, La, Mg, Ba, Ti, Pb, and combinations thereof. The formation methods of the gate dielectric layers 92 may include Molecular-Beam Deposition (MBD), ALD, PECVD, and the like.

The gate electrodes 94 are deposited over the gate dielectric layers 92, respectively, and fill the remaining portions of the recesses 90. The gate electrodes 94 may be a metal-containing material such as TiN, TaN, TaC, Co, Ru, Al, combinations thereof, or multi-layers thereof. For example, although a single gate electrode 94 is illustrated, any number of work function tuning layers may be deposited in the recesses 90. After the filling of the gate electrodes 94, a planarization process, such as a CMP, may be performed to remove the excess portions of the gate dielectric layers 92 and the material of the gate electrodes 94, which excess portions are over the top surface of the ILD 88. The remaining portions of material of the gate electrodes 94 and the gate dielectric layers 92 thus form replacement gates of the resulting FinFETs. The gate electrodes 94 and the gate dielectric layers 92 may be collectively referred to as a "gate" or a "gate stack." The gate and the gate stacks may extend along sidewalls of a channel region of the fins 58.

The formation of the gate dielectric layers 92 in the region 50B and the region 50C may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and the gate electrodes 94 in each region may be formed by distinct processes, such that the gate electrodes 94 may be different materials. Various masking steps may be used to mask and expose appropriate regions when using distinct processes.

Figure 15B:
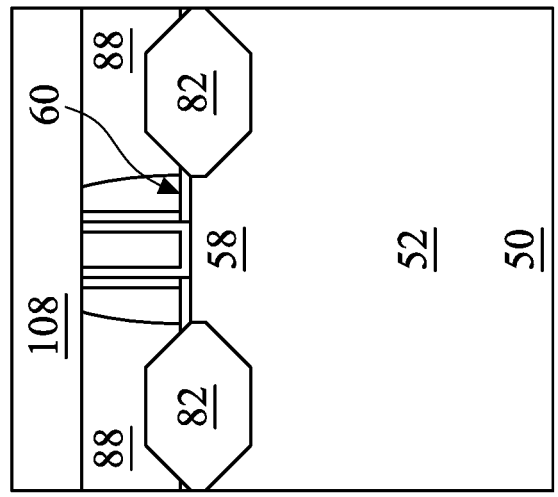
Figure 15A:
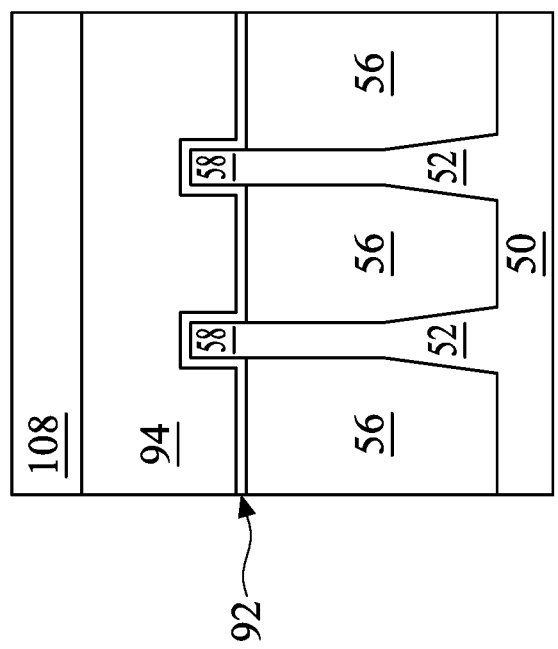

In FIGS. 15A and 15B, an ILD 108 is deposited over the ILD 88. In an embodiment, the ILD 108 is a flowable film formed by a flowable CVD method. In some embodiments, the ILD 108 is formed of a dielectric material such as PSG, BSG, BPSG, USG, or the like, and may be deposited by any suitable method, such as CVD and PECVD.

Figure 16B:
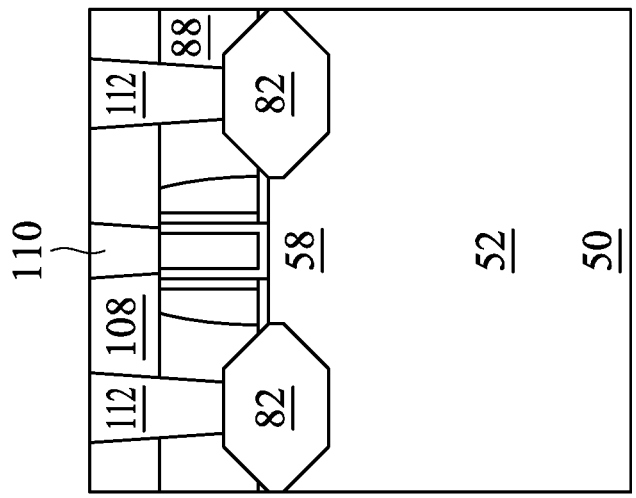
Figure 16A:
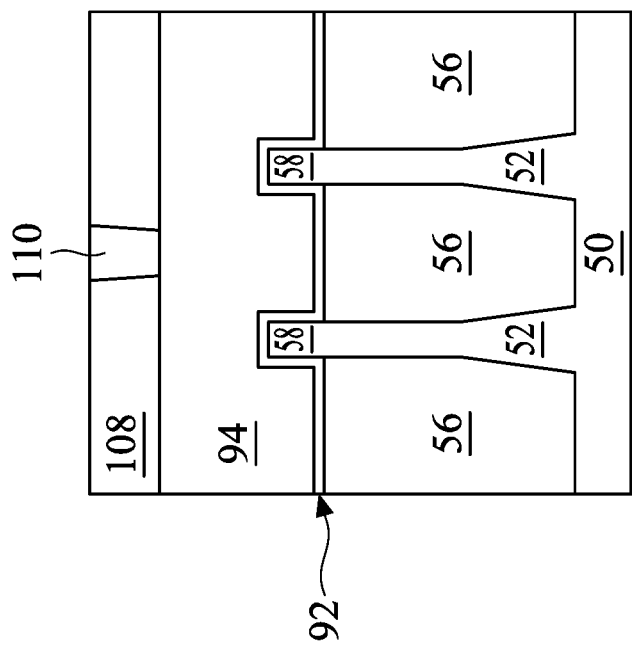

In FIGS. 16A and 16B, contacts 110 and 112 are formed through the ILD 108 and the ILD 88 using embodiment contact formation processes as discussed below with respect to FIGS. 17 through 29. In some embodiments, an anneal process may be performed to form a silicide at the interface between the epitaxial source/drain regions 82 and the contacts 112 prior to the contacts 112 being formed. The contact 110 is physically and electrically connected to the gate electrode 94, and the contacts 112 are physically and electrically connected to the epitaxial source/drain regions 82. FIGS. 16A and 16B illustrate the contacts 110 and 112 in a same cross-section; however, in other embodiments, the contacts 110 and 112 may be disposed in different cross-sections. Further, the position of contacts 110 and 112 in FIGS. 16A and 16B are merely illustrative and not intended to be limiting in any way. For example, the contact 110 may be vertically aligned with the fin 52 as illustrated or may be disposed at a different location on the gate electrode 94. Furthermore, the contacts 112 may be formed prior to, simultaneously with, or after forming the contacts 110.

FIGS. 17 through 29 illustrate cross-sectional views for forming contacts 112 according to various embodiments. Although the processes discussed are in the context of source/drain contacts, these processes may be equally applicable to gate contacts, vias in interconnect structures, or the like.

Figure 17:
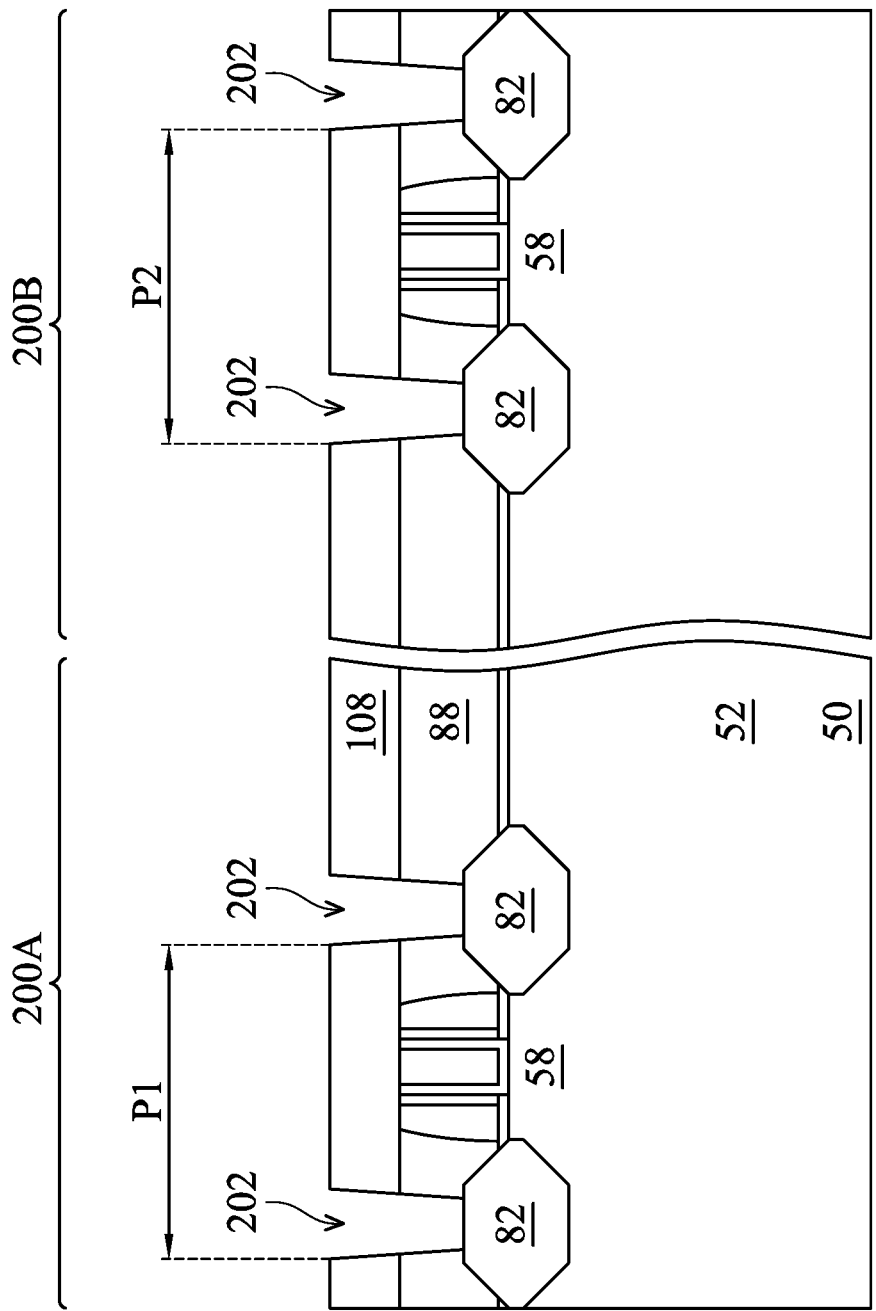
FIGS. 17, 18, 19, 20, 21, 22, 23, 24, 25, 26, 27, 28, and 29 are cross-sectional views of intermediate stages in the manufacturing of contact plugs, in accordance with some embodiments.

FIG. 17 illustrates a cross-section view of different regions of the device, such as, region 200A and region 200B. The region 200A and/or the region 200B may each be disposed in the region 50B, the region 50C, or elsewhere on the device. In some embodiments, the region 200A and the region 200B are disposed adjacent each other. In other embodiments, the region 200A and the region 200B are spaced apart, and any number of device features (e.g., other active devices, doped regions, isolation structures, etc.) may be disposed between the region 200A and the region 200B.

The region 200A may be an area with smaller pitched devices compared to the region 200B, such that, source/drain regions 82 in the region 200A are spaced closer together than source/drain regions 82 in the region 200B. For example, a density of features in the region 200A is greater than a density of features in the region 200B.

In FIG. 17, contact openings 202 are patterned through the ILDs 88 and 108 using, for example, a combination of photolithography and etching. Openings 202 expose top surfaces of the source/drain regions 82, and source/drain contacts are subsequently formed in openings 202. Openings 202 in the region 200A have a pitch P1 while openings 202 in the region 200B have a pitch P2. In some embodiments, pitch P1 is smaller than pitch P2.

Figure 18:
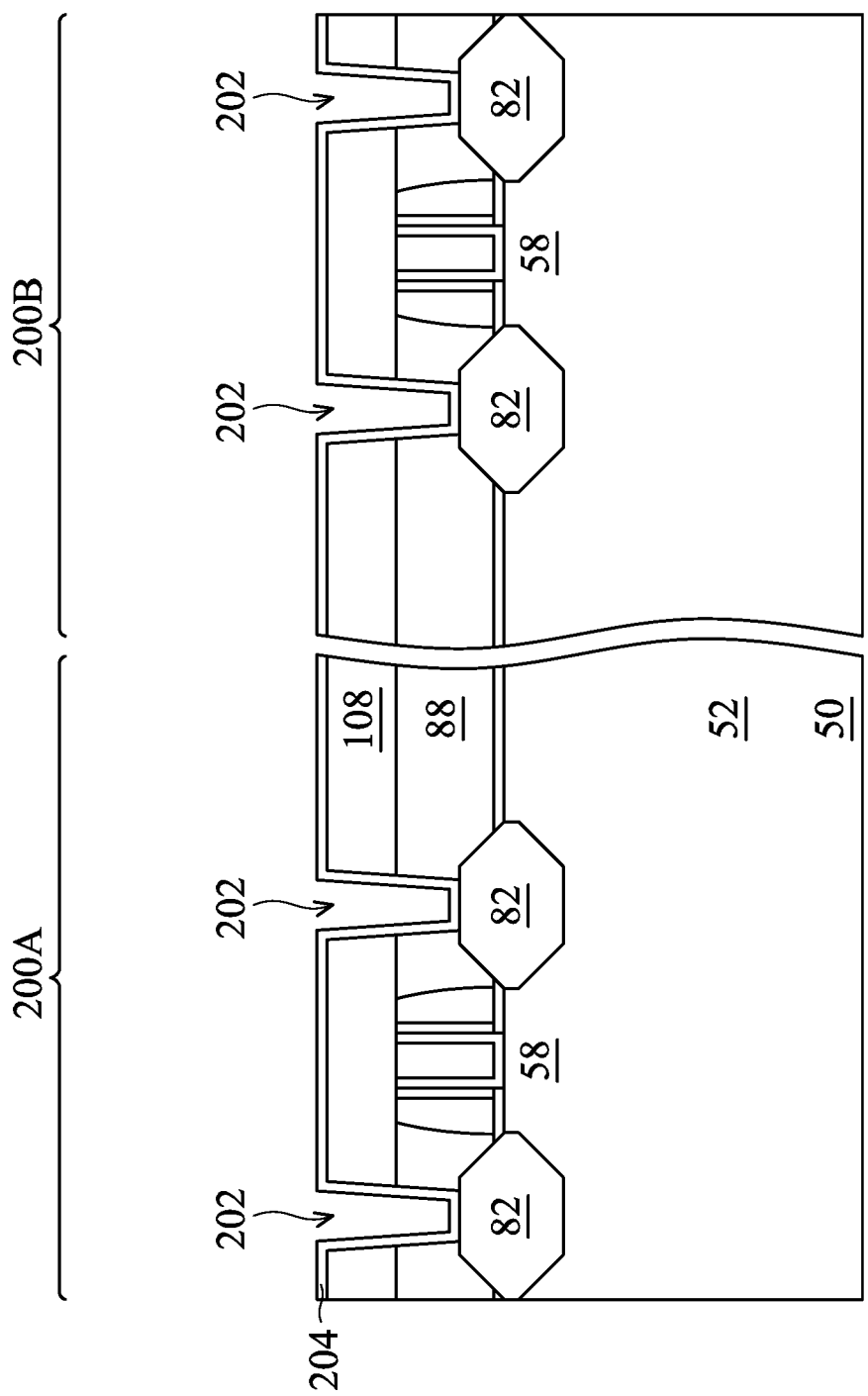

In FIG. 18, an adhesion layer 204 is deposited along sidewalls and a bottom surface of the openings 202. The adhesion layer 204 may be deposited using a conformal deposition process, such as, CVD, ALD, or the like. In some embodiments, the adhesion layer 204 comprises titanium nitride. In other embodiments, other suitable materials, such as, titanium oxide, tantalum nitride, tantalum oxide, tungsten carbon, or the like may be used. In embodiments where the adhesion layer 204 comprises carbon, a concentration of carbon in the adhesion layer 204 may be adjusted in accordance with a desired etching rate of the adhesion layer 204 in subsequent processing steps. The adhesion layer 204 may be used to improve adhesion of subsequently formed contacts in the openings 202 with the ILDs 88 and 108. In some embodiments, the adhesion layer 204 may also function as a diffusion barrier layer, which helps reduce diffusion of a material of the subsequently formed contacts in the openings 202 into the ILDs 88 and 108. In some embodiments, a thickness of the adhesion layer 204 may be less than about 30 Å in some embodiments.

Figure 19:
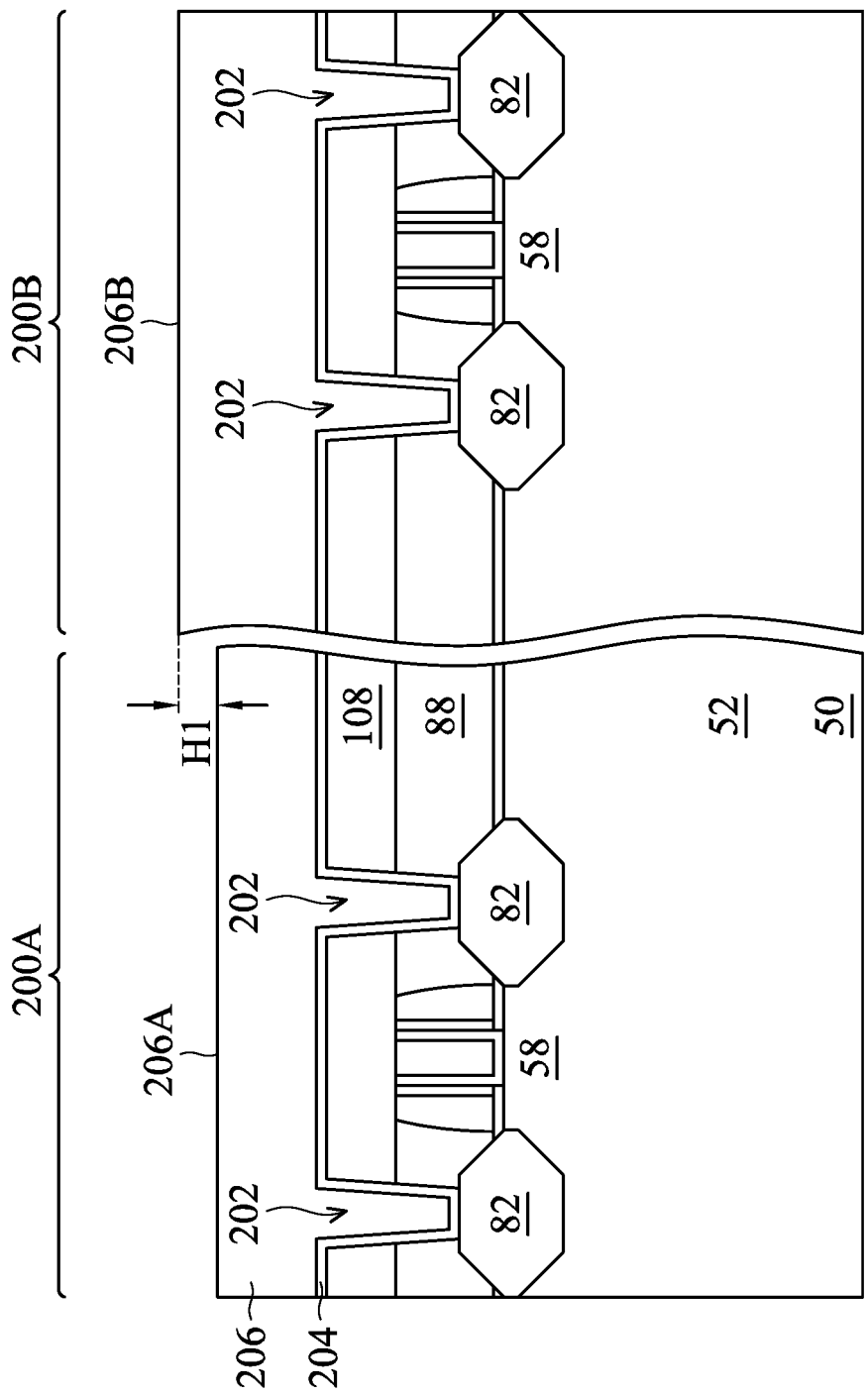

In FIG. 19, a mask layer 206 (e.g., a photoresist, a backside antireflective coating layer (BARC) material, or the like) is deposited over the adhesion layer 204 and in the openings 202. The mask layer 206 may be deposited to overfill the openings 202 such that the mask layer 206 extends above the openings 202. The mask layer 206 may comprise any dielectric material having etch selectivity with the adhesion layer 204 and the ILDs 88 and 108 relative a same etch process. For example, a ratio of the etch rate of mask layer 206 to the etch rate of adhesion layer 204 may be in the range of about 5 to about 8 relative a same etch process (e.g., the etch process described with respect to FIGS. 22 and 27 below). As another example, a ratio of the etch rate of adhesion layer 204 to the etch rate of the ILD 108 may be in the range of about 1.5 to about 2.5 relative a same etch process (e.g., the etch process described with respect to FIG. 23 below).

The mask layer 206 may be deposited using a blanket deposition process, such as, a spin-on process. Because features in the region 200A have a greater density than features in the region 200B, a deposition rate of the mask layer 206 may not be uniform across different regions (e.g., the region 200A and the region 200B). For example, a deposition rate of the mask layer 206 may be greater in the region 200B (e.g., having lower density features) than in the region 200A (e.g., having higher density features). As a result, a topmost surface 206B of the mask layer 206 in the region 200B may be higher than a topmost surface 206A of the mask layer 206 in the region 200A. A difference in height between the surface 206B and the surface 206A is denoted as height H1 in FIG. 19. In some embodiments, height H1 is greater than 10 nm. This difference in height is referred to as a loading effect and may cause defects during subsequent processing. Various embodiments aim to ameliorate this loading effect using the processes discussed below.

Figure 20:
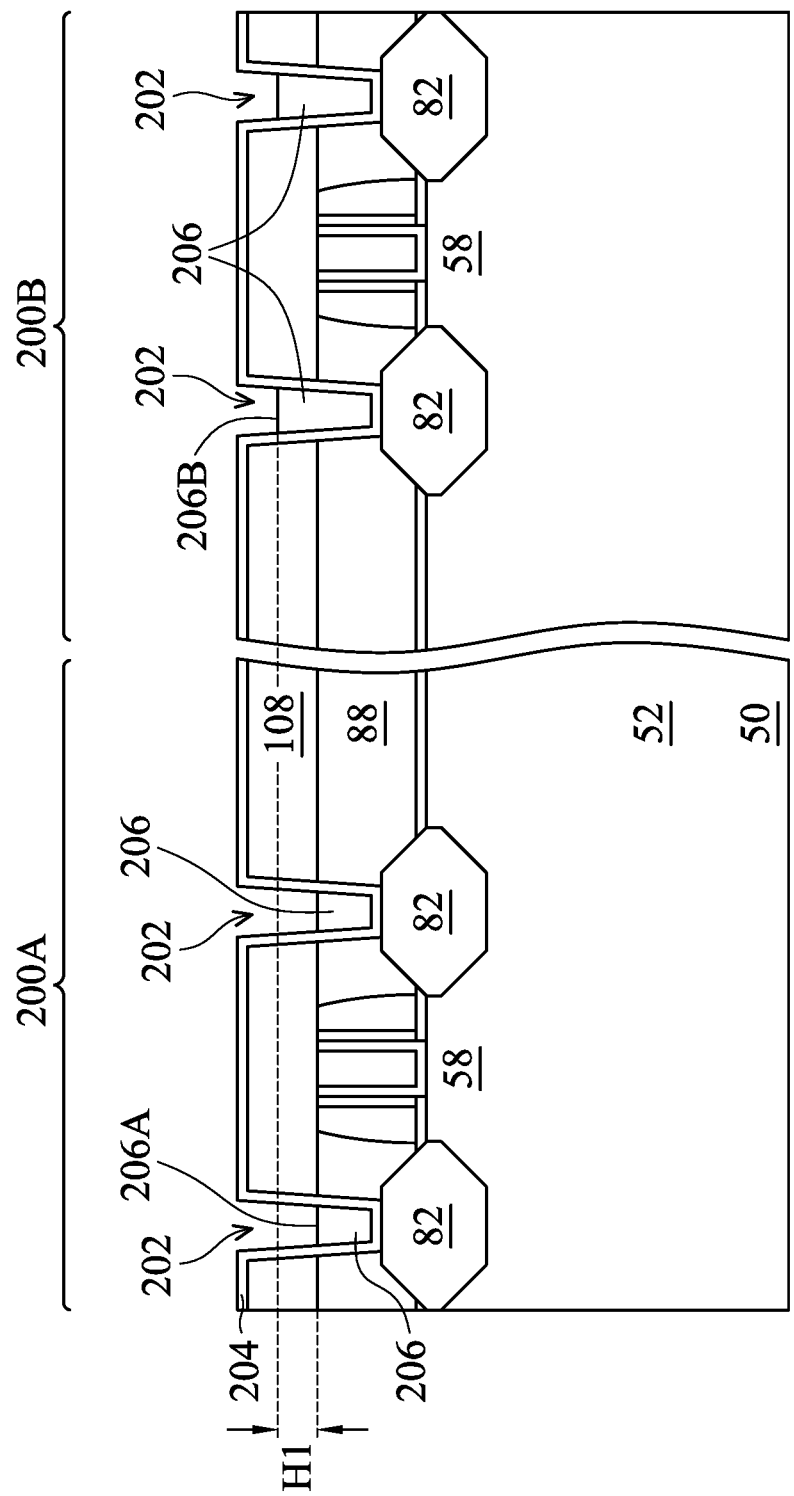

In FIG. 20, the mask layer 206 is patterned using, for example, an etch back process to remove portions of the mask layer 206 above the openings 202 and to recess top surfaces of the mask layer 206 below a top surface of ILD 108. In various embodiments, the etch back process exposes adhesion layer 204 on the upper sidewalls of the openings 202. The etch back process may include a dry etch using an etchant comprising $C_xF_y$ (e.g., $CF_4$). The etchant may also comprise one or more inert gases, such as, oxygen, nitrogen, argon, hydrogen, or the like. Other etching processes and/or etchants may be used as well. The etch back process may be selected so that the mask layer 206 is etched without significantly etching the adhesion layer 204. The etch back process may substantially maintain the loading effect illustrated by FIG. 19. For example, a difference in height between a topmost surface 206A of the mask layer 206 in the region 200A and a topmost surface 206B of the mask layer 206 in the region 200B after the etch back process remains at substantially height H1.

Figure 21:
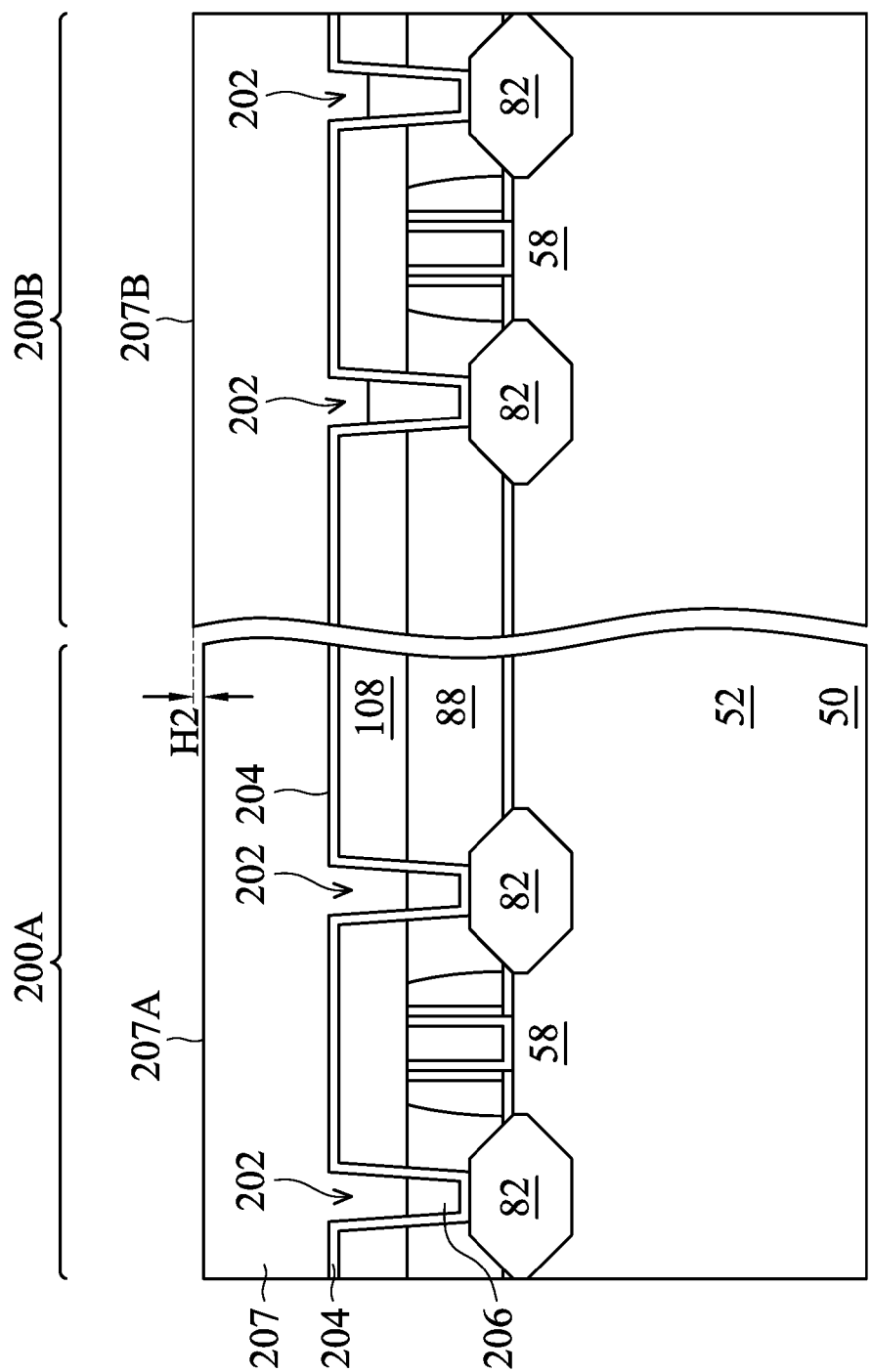

In FIG. 21, an additional mask layer 207 is deposited on the mask layer 206. The mask layer 207 may be deposited to overfill the openings 202 such that the mask layer 207 extends above the openings 202. The mask layer 207 may comprise any dielectric material having etch selectivity with the adhesion layer 204 and the ILDs 88 and 108 relative a same etch process. In some embodiments, the mask layer 207 comprises a same material as the mask layer 206. In other embodiments, the mask layer 207 comprises a different material than the mask layer 206. For example, the mask layer 206 may comprise a thermal oxide, and the mask layer 207 may comprise a flow able oxide.

The mask layer 207 may be deposited using a blanket deposition process, such as, a spin-on process. As discussed above, the region 200A have a greater density than features in the region 200B, which causes a loading effect. However, it has been observed that by partially filling the openings 202 (e.g., with the material of the mask layer 206), the loading effect is reduced during the deposition of the mask layer 207. A topmost surface 207B of the mask layer 207 in the region 200B may be still be higher than a topmost surface 207A of the mask layer 207 in the region 200A, and a difference in height between the surface 207B and the surface 207A is denoted as height H2. However, height H2 (differences in height of the mask layer 207 across different regions) may be less than height H1 (differences in height of the mask layer 206 across different regions, see FIGS. 19 and 20).

Figure 22:
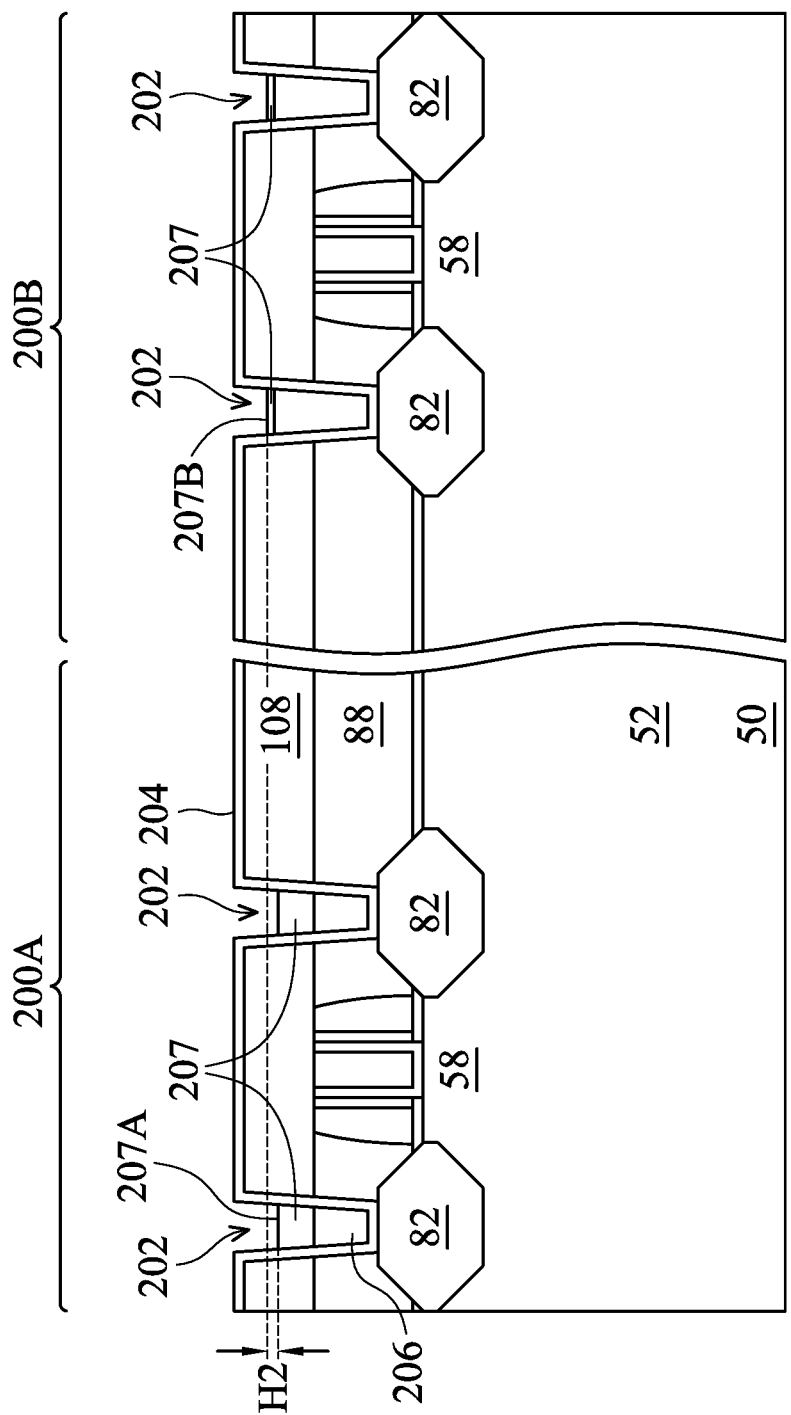

In FIG. 22, the mask layer 207 is patterned using, for example, an etch back process to remove portions of the mask layer 207 above the openings 202 and to recess top surfaces of the mask layer 207 below a top surface of ILD 108. In various embodiments, the etch back process of the mask layer 207 exposes adhesion layer 204 on the upper sidewalls of the openings 202. The etch back process may include a dry etch using an etchant comprising $C_xF_y$ (e.g., $CF_4$). The etchant may also comprise one or more inert gases, such as, oxygen, nitrogen, argon, hydrogen, or the like. Other etching processes and/or etchants may be used as well. The etch back process may be selected so that the mask layer 207 is etched without significantly etching the adhesion layer 204. The etch back process may substantially maintain the loading effect illustrated by FIG. 21, which is reduced from the loading effect illustrated by FIG. 20. For example, a difference in height between a topmost surface 207A of the mask layer 207 in the region 200A and a topmost surface 207B of the mask layer 207 in the region 200B after the etch back process remains at substantially height H2, which is less than a difference in height between a topmost surface of the mask layer 206 in the region 200A and a topmost surface of the mask layer 206 in region 200B (denoted as H1, see FIGS. 19 and 20). Thus, the loading effect during the formation of the mask layer 206 is advantageously reduced. In some embodiments, height H2 is less than 10 nm. It has been observed that when height H2 is less than 10 nm, defects resulting from subsequent manufacturing processes can be reduced.

In other embodiments, height H2 may be greater than 10 nm. In such embodiments, the process described in FIGS. 21 and 22 may be repeated until a height difference of the etched-back mask layers in the openings 202 in the region 200A and the region 200B is within a desired threshold. In some embodiments, the desired threshold is 10 nm. For example, additional mask layers may be sequentially deposited into the openings 202 and etched back below a top surface of the ILD 108. With each additional mask layer, the pattern loading effect may be reduced compared to a previously deposited and patterned mask layer. For example, a height difference in top most surfaces of each subsequently deposited mask layer within the region 200A and the region 200B is reduced compared to a previously deposited mask layer.

Figure 23:
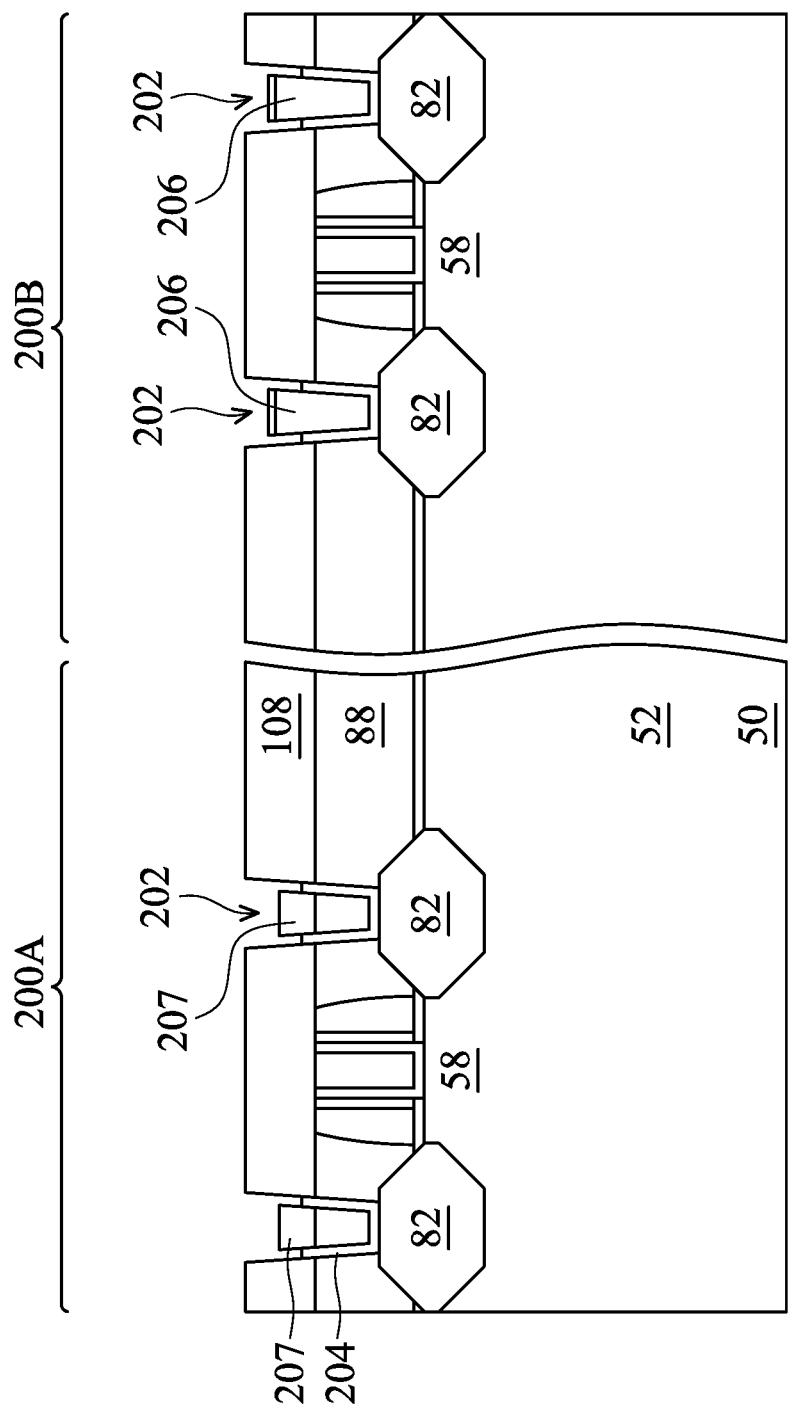

In FIG. 23, the adhesion layer 204 is patterned using, for example, a wet etch process. Patterning the adhesion layer 204 may include removing portions of the adhesion layer 204 outside of the openings 202. In some embodiments, patterning the adhesion layer 204 may further include etching the adhesion layer 204 below a top surface of the mask layers (e.g., the mask layers 206 and 207) in the openings 202. Patterning the adhesion layer 204 exposes the ILD 108 at the upper portions of the openings 202. Embodiment wet etch processes for patterning the adhesion layer 204 may comprise using diluted hydrofluoric (HF) acid as an etchant. Due to etch selectivity between the adhesion layer 204 the mask layers 206/207, etching the adhesion layer 204 may not significantly etch the mask layers 206/207. Other patterning processes may be used as well in other embodiments.

Figure 24:
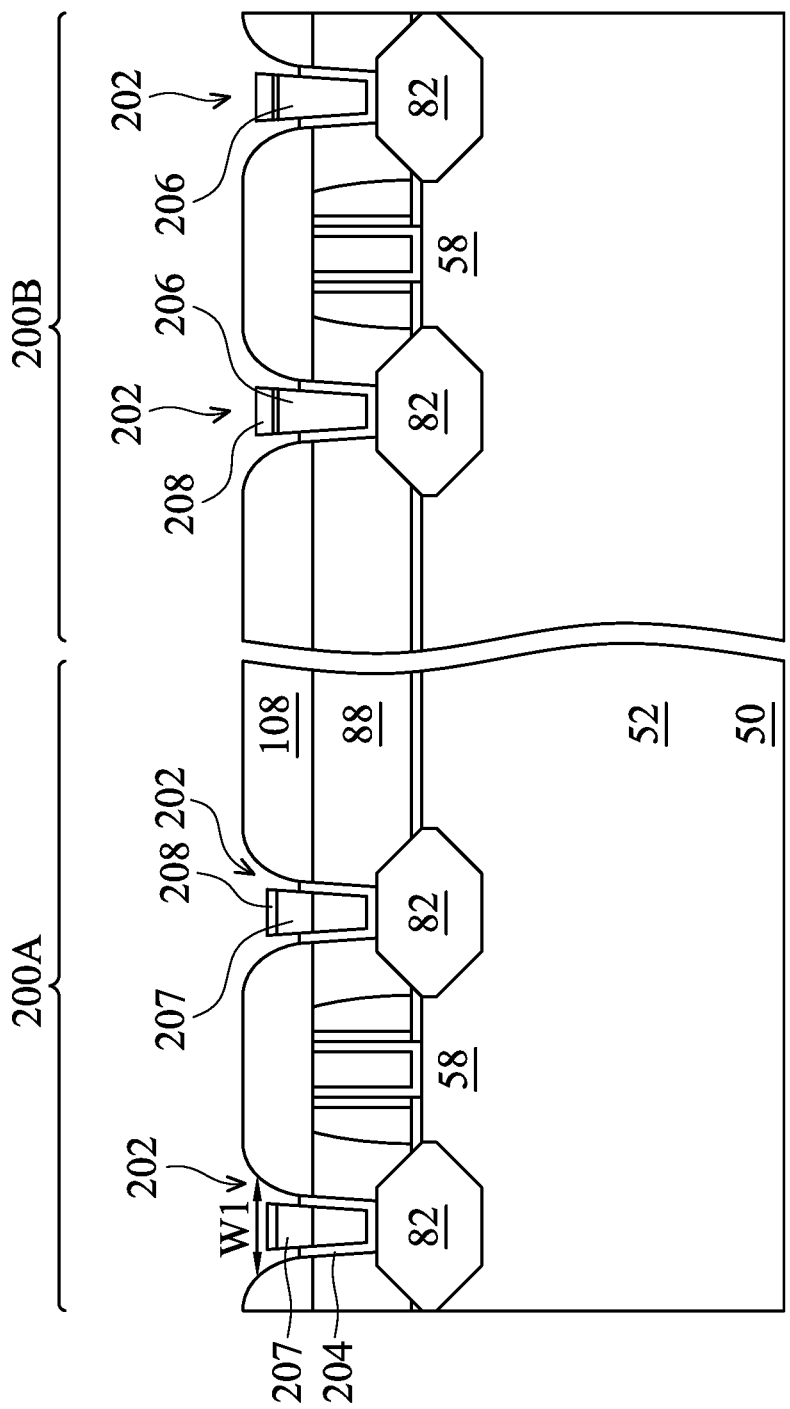

In FIG. 24, upper portions of the openings 202 are widened, for example, by patterning the ILD 108. Patterning the ILD 108 may include a dry and/or wet etch process, which rounds corners of the ILD 108 in the openings 202. For example, after ILD 108 is patterned, sidewalls of the openings 202 are more vertical in bottom portions of the opening 202 (e.g., portions masked by the mask layers) than in the upper portions of the openings 202 (e.g., areas were ILD 108 is patterned). Example dry etchants for the ILD 108 may include SiConi ($NF_3$ and $NH_3$), Certas (HF and $NH_3$), or the like. Example wet etchants for the ILD 108 may include diluted hydrofluoric (HF) acid or the like. In an embodiment, diluted HF acid in combination with $O_3$, and/or $H_2O_2$ may be used to pattern the adhesion layer 204 (e.g., as described above in FIG. 23) and widen upper portions of the openings 202 (e.g., as described in FIG. 24) using a same etching process. A timed process may be used to widen upper portions of the openings 202 to a desired width W1. In some embodiments, width W1 is in the range of about 12 nm to about 20 nm.

Figure 25:
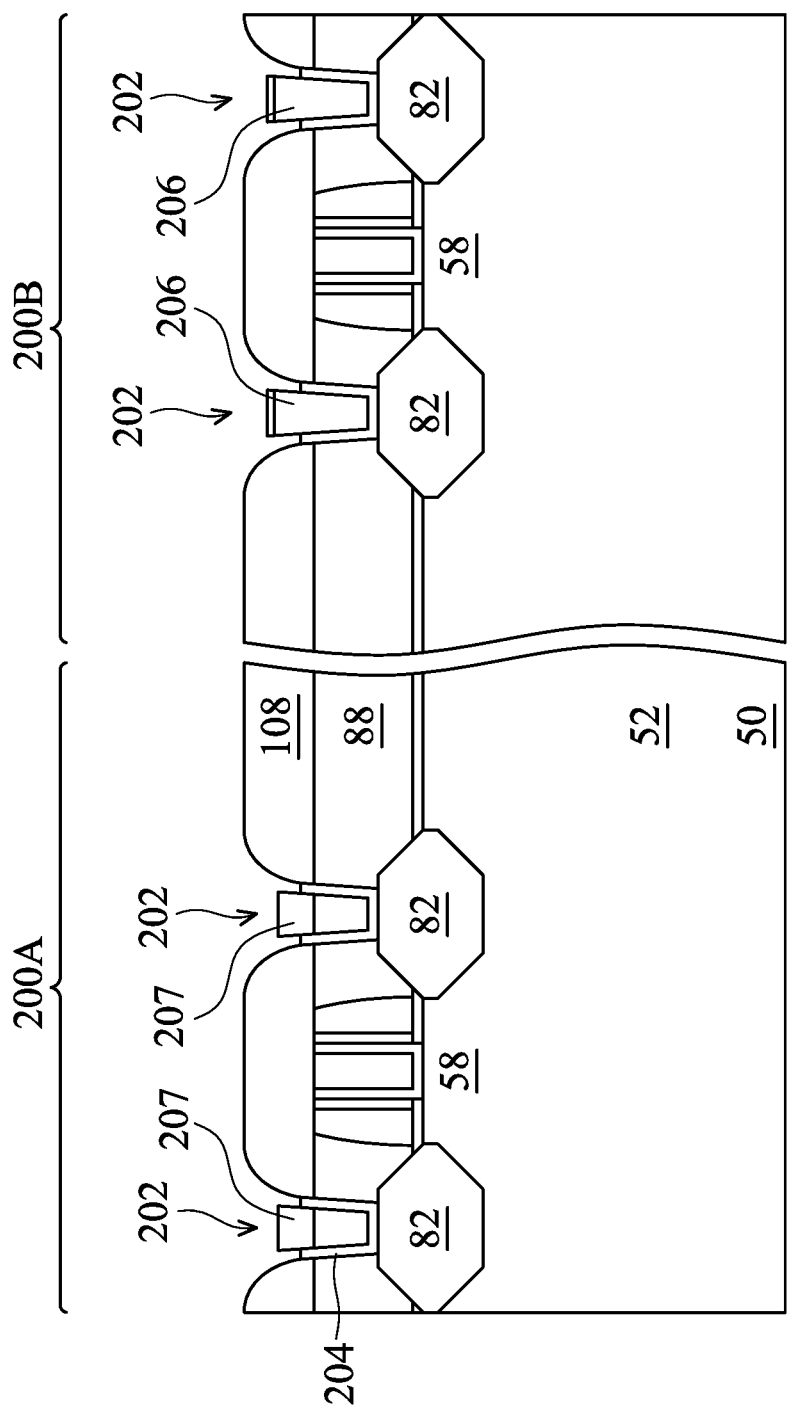

During widening of the upper portions of the openings 202, the mask layers in the openings 202 (e.g., mask layers 206 and 207) may help mask the adhesion layer 204 and bottom areas of the openings 202 from damage as a result of the patterning process. In some embodiments, the patterning process used to etch the ILD 108 may leave a residue 208 on a top surface of the mask layers 206/207. Subsequently, the residue 208 may be removed, for example, using a $C_xF_y$, (e.g., $C_4F_6$) plasma etch. The resulting structure is illustrated in FIG. 25.

Figure 26:
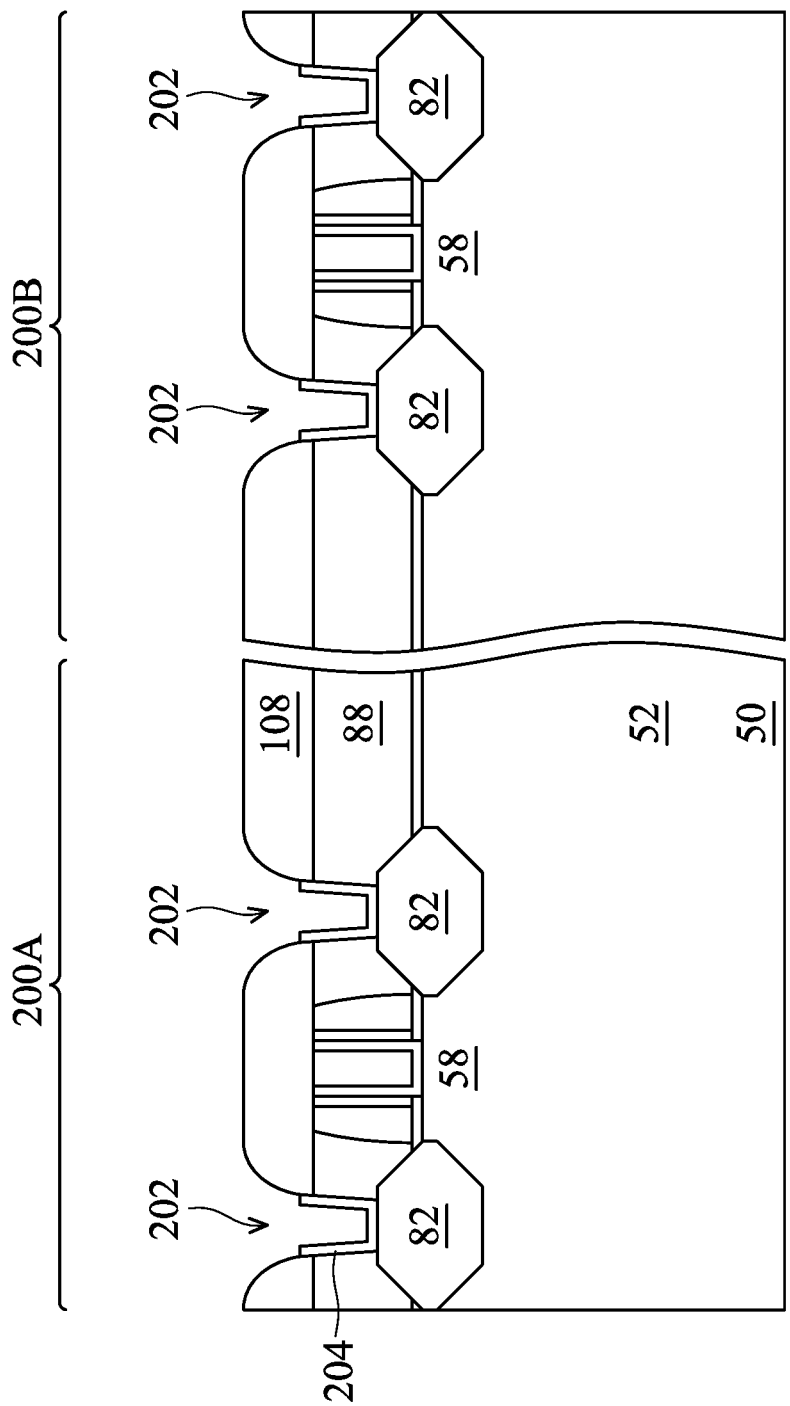

In FIG. 26, the mask layers in the openings 202 are removed. Although FIGS. 25 and 26 illustrate the removal of two mask layers (the mask layers 206 and 207), in embodiments where additional mask layers are deposited and etched back in the openings, the additional mask layers may also be removed. Removing the mask layers in the openings 202 may comprise a plasma etching process using, for example oxygen plasma (e.g., gamma radiation). Other gases, such as hydrogen and nitrogen, may also be present during the plasma etching to remove the mask layers in the openings 202. Removing the mask layers in the openings 202 may expose the adhesion layer 204 in the openings 202.

Figure 27:
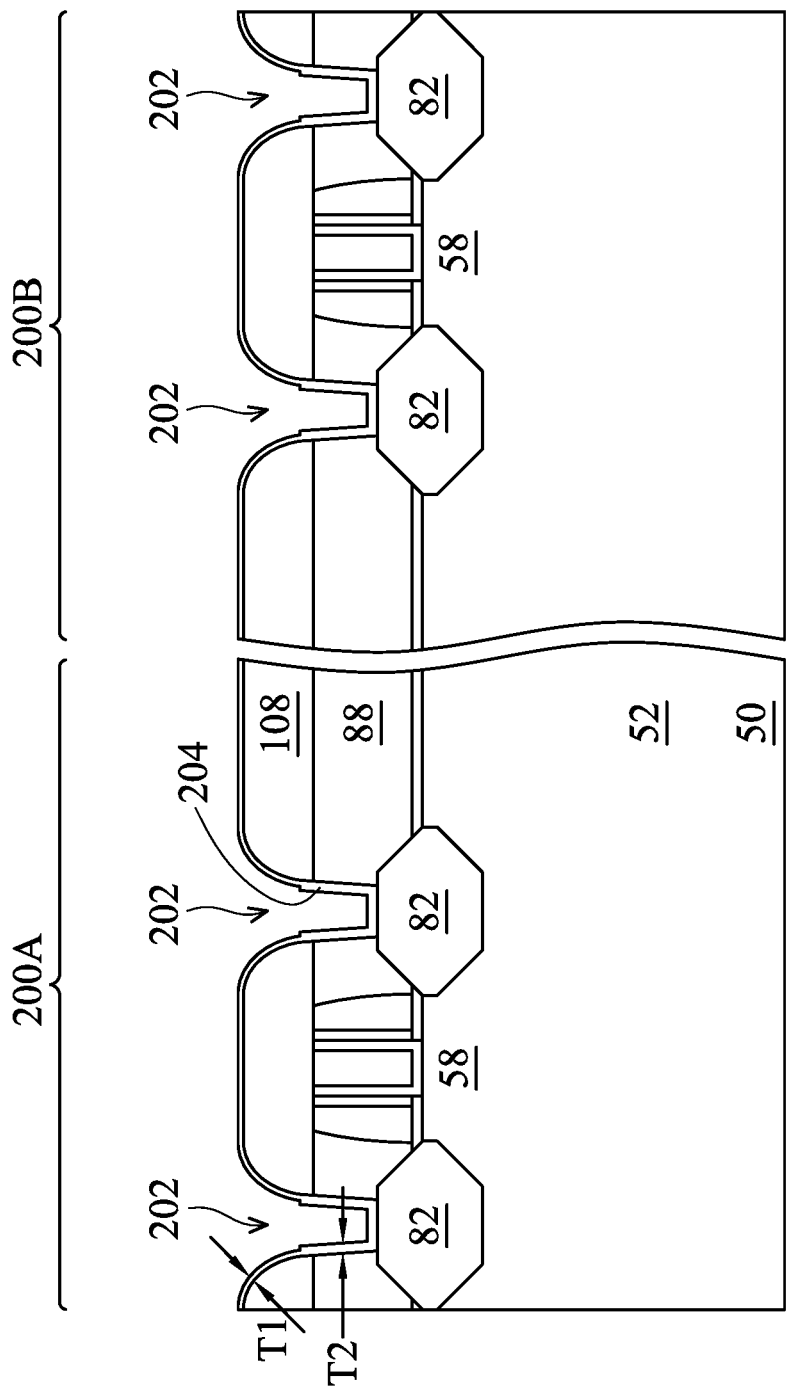

In FIG. 27, a deposition process is performed to deposit additional material for the adhesion layer 204 on exposed surfaces of the openings 202 and over the ILD 108. Depositing the additional material for the adhesion layer 204 may include depositing a same material using a same process as discussed above with respect to FIG. 18. For example, the additional material may be the same as a material (e.g., TiN) of the adhesion layer 204 previously deposited in the openings 202. Furthermore, depositing the additional material may comprise a CVD process, an ALD process, or the like. In some embodiments, the deposition process deposits the material of the adhesion layer 204 faster on material of the ILD 108 (e.g., an oxide) than on the pre-existing adhesion layer 204 in the openings 202. After deposition, the adhesion layer 204 has a first thickness Ti in an upper portion of the openings 202 and a second thickness T2 in a lower portion of the openings 202. Thickness T1 may be less than thickness T2.

Figure 28:
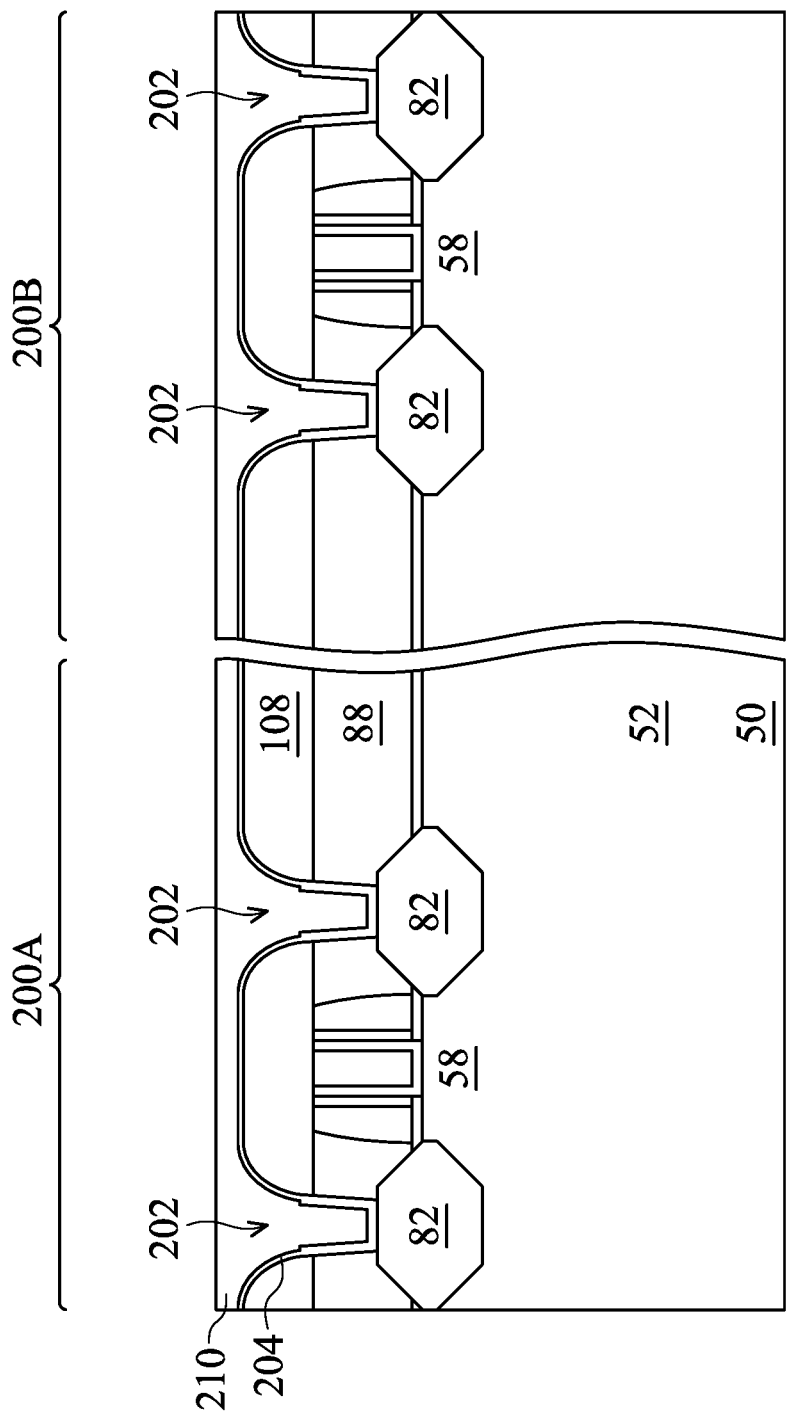

In FIG. 28, a conductive material 210 is deposited in the openings 202 over the adhesion layer 204. In some embodiments, the conductive material 210 comprises cobalt, tungsten, aluminum, ruthenium, copper, combinations thereof, or the like. In embodiments where the conductive material 210 comprises cobalt, the resulting contacts may have improved electrical characteristics (e.g., lower resistance and RC delay). Depositing the conductive material 210 may include a plating process, such as, electro-chemical plating, electroless plating, or the like. Due to the widening of upper portions of the openings 202 discussed above, the conductive material 210 may be deposited in the openings 202 with a wider process window and fewer defects (e.g., voids).

Figure 29:
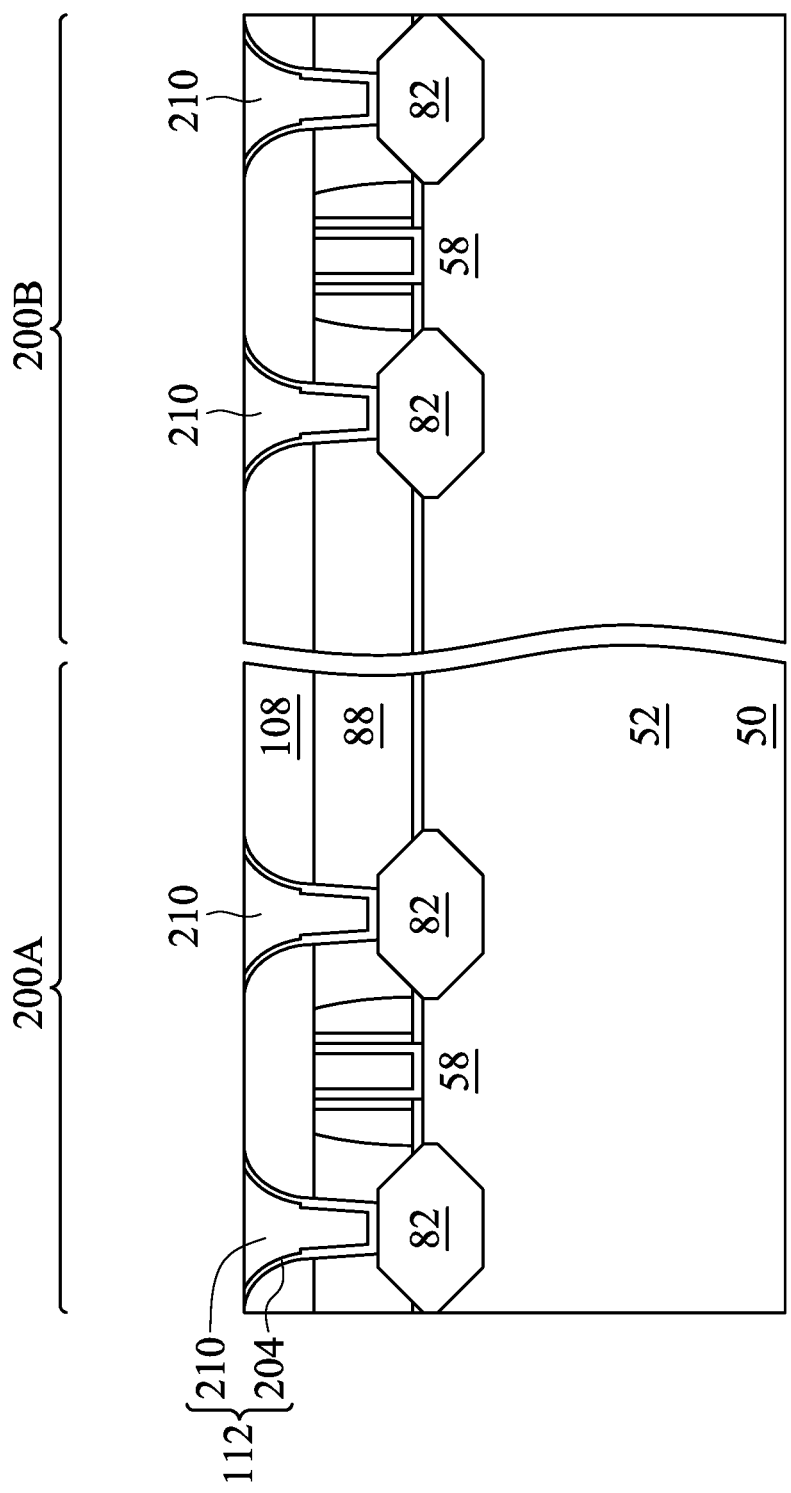

The conductive material 210 may be deposited to overfill the openings 202 so that the conductive material 210 is also deposited over top surfaces of the ILD 108. Subsequently, a planarization process (e.g., CMP or etch back process) may be used to remove excess portions of the conductive material 210 and excess portions of the adhesion layer 204 outside of the openings 202. The resulting structure is illustrated in FIG. 29. Thus, source/drain contacts 112 (comprising adhesion layer 204 and conductive material 210) may be formed to extend through the ILDs 108 and 88 to electrically connect to source/drain regions 82. Adhesion layer 204 extends along sidewalls and a bottom surface of the conductive material 210. The adhesion layer 204 may improve adhesion between the conductive material 210 and the ILDs 88/108. In some embodiments, the adhesion layer 204 may also provide a diffusion barrier layer, which reduces diffusion of the material of the conductive material 210 into the surrounding dielectric layers (e.g., ILDs 88/108).

Thus, as discussed above a process and resulting structure for a contact is described. In some embodiments, an opening is patterned through one or more dielectric layers. An adhesion layer is deposited in the opening prior to depositing the conductive material. A mask layer may be deposited over the adhesion layer in the opening, and the mask layer may be etched back to expose upper portions of the adhesion layer while the opening is widened. Widening the opening may advantageously provide a larger process window for forming contacts in the opening with fewer defects (e.g., voids). In some embodiments, the mask layer protects bottom portions of the adhesion layer while the upper portions of the opening are widened. In some embodiments, the mask layer comprises a plurality of mask layers, which are each deposited and etched back prior to widening the opening in order to mitigate a pattern loading effect caused by different pattern densities of a device during processing. For example, the mask layer may include at least two mask layers, which are sequentially deposited and etched back prior to widening the opening. Thus, various embodiments provide manufacturing methods and resulting structures for contact plugs with fewer defects, reduced resistance, and increased yield.

In accordance with an embodiment, a method includes patterning an opening through a dielectric layer; depositing an adhesion layer along sidewalls and a bottom surface of the opening; depositing a first mask layer in the opening over the adhesion layer; etching back the first mask layer below a top surface of the dielectric layer; widening an upper portion of the opening after etching back the first mask layer, wherein the first mask layer masks a bottom portion of the opening while widening the upper portion of the opening; removing the first mask layer after widening the upper portion of the opening; and after removing the first mask layer, forming a contact in the opening by depositing a conductive material in the opening over the adhesion layer. In an embodiment, etching back the first mask layer exposes a portion of the adhesion layer, and the method further includes removing of the adhesion layer, the opening exposes a sidewall of the dielectric layer after the portion of the adhesion layer is removed. In an embodiment, widening the upper portion of the opening comprises etching the sidewall of the dielectric layer. In an embodiment, the method further includes depositing an additional material of the adhesion layer along sidewalls of the opening after widening the upper portion of the opening. In an embodiment, a deposition rate of the additional material is faster on the dielectric layer than on a material of the adhesion layer pre-existing in the opening before depositing the additional material. In an embodiment, the method further includes depositing a second mask layer over the first mask layer in the opening; and etching back the second mask layer below the top surface of the dielectric layer before widening the upper portion of the opening. In an embodiment, the conductive material comprises cobalt, the adhesion layer comprises titanium nitride, and the contact is a source/drain contact or a gate contact. In an embodiment, widening the upper portion of the opening forms a residue directly over the first mask layer. In an embodiment, the method further includes removing the residue before removing the first mask layer, and removing the residue uses a different etching process than removing the first mask layer.

In accordance with an embodiment, a method includes patterning a first opening through a dielectric layer in a region of a device; patterning a second opening through the dielectric layer in a region of the device; depositing a first mask layer in the first opening and the second opening; and etching back the first mask layer so that a first top surface of the first mask layer in the first opening and a second top surface of the first mask layer in the second opening are below a top surface of the dielectric layer. The method further includes depositing a second mask layer over the first mask layer in the first opening and the second opening and etching back the second mask layer so that a third top surface of the second mask layer in the first opening and a fourth top surface of the second mask layer in the second opening are below a top surface of the dielectric layer. The third top surface is lower than the fourth top surface by a second distance less than the first distance. In accordance with an embodiment, a pattern density of first features in the region is greater than a pattern density of second features in the region. In accordance with an embodiment, the first mask layer, as deposited, extends higher in the region than in the region by a third distance. In accordance with an embodiment, the second mask layer, as deposited, extends higher in the region than in the region by a fourth distance less than the third distance. In accordance with an embodiment, the first distance is greater than 10 nm, and the second distance is less than 10 nm. In accordance with an embodiment, the method further includes depositing a third mask layer over the first mask layer in the first opening and the second opening and etching back the third mask layer so that a fifth top surface of the third mask layer in the first opening and a sixth top surface of the third mask layer in the second opening are below a top surface of the dielectric layer, wherein the fifth top surface is lower than the sixth top surface by a fifth distance less than the second distance. In accordance with an embodiment, after etching back the second mask layer, widening upper portions of the first opening and the second opening; after widening the upper portions of the first opening and the second opening, removing the first mask layer and the second mask layer; forming a first contact in the first opening; and forming a second contact in the second opening. In accordance with an embodiment, the method further includes depositing an adhesion layer over and along sidewalls of the first opening and the second opening, wherein the first mask layer is deposited over the adhesion layer; before widening the upper portions of the first opening and the second opening, removing portions of the adhesion layer over the second mask layer; and after removing the first mask layer and the second mask layer, depositing an additional material of the adhesion layer on sidewalls of the first opening and the second opening. In accordance with an embodiment, removing the portions of the adhesion layer includes etching a portion of the adhesion layer in the first opening below the third top surface and etching a portion of the adhesion layer in the second opening below the fourth top surface.

In accordance with an embodiment, a semiconductor device includes a low-k dielectric layer; and a contact plug comprising a conductive material and an adhesion layer along sidewalls and a bottom surface of the conductive material. The conductive material is wider in an upper portion of the low-k dielectric layer than in a lower portion of the low-k dielectric layer, and the adhesion layer is thinner in an upper portion of the low-k dielectric layer than in a lower portion of the low-k dielectric layer. In accordance with an embodiment, the conductive material comprises cobalt, the adhesion layer comprises titanium nitride, and the contact plug is a source/drain contact or a gate contact. In accordance with an embodiment, a sidewall of the conductive material is more vertical in the lower portion of the low-k dielectric layer than the upper portion of the low-k dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    patterning an opening through a dielectric layer;
    depositing an adhesion layer along sidewalls and a bottom surface of the opening;
    depositing a first mask layer in the opening over the adhesion layer;
    etching back the first mask layer below a top surface of the dielectric layer;
    widening an upper portion of the opening after etching back the first mask layer, wherein the first mask layer masks a bottom portion of the opening while widening the upper portion of the opening;
    removing the first mask layer after widening the upper portion of the opening; and
    after removing the first mask layer, forming a contact in the opening by depositing a conductive material in the opening over the adhesion layer.

2. The method of claim 1, wherein etching back the first mask layer exposes a portion of the adhesion layer, and wherein the method further comprises removing the portion of the adhesion layer, wherein the opening exposes a sidewall of the dielectric layer after the portion of the adhesion layer is removed.

3. The method of claim 2, wherein widening the upper portion of the opening comprises etching the sidewall of the dielectric layer.

4. The method of claim 2 further comprising depositing an additional material of the adhesion layer along sidewalls of the opening after widening the upper portion of the opening.

5. The method of claim 4, wherein a deposition rate of the additional material is faster on the dielectric layer than on a material of the adhesion layer pre-existing in the opening before depositing the additional material.

6. The method of claim 4 further comprising:
    depositing a second mask layer over the first mask layer in the opening; and
    etching back the second mask layer below the top surface of the dielectric layer before widening the upper portion of the opening.

7. The method of claim 1, wherein the conductive material comprises cobalt, wherein the adhesion layer comprises titanium nitride, and wherein the contact is a source/drain contact or a gate contact.

8. The method of claim 1, widening the upper portion of the opening forms a residue directly over the first mask layer, wherein the method further comprises removing the residue before removing the first mask layer, and wherein removing the residue uses a different etching process than removing the first mask layer.

9. A method comprising:
    patterning a first opening through a dielectric layer in a first region of a device;
    patterning a second opening through the dielectric layer in a second region of the device;
    depositing a first mask layer in the first opening and the second opening;

etching back the first mask layer so that a first top surface of the first mask layer in the first opening and a second top surface of the first mask layer in the second opening are below a top surface of the dielectric layer, wherein the first top surface is lower than the second top surface by a first distance;

depositing a second mask layer over the first mask layer in the first opening and the second opening; and etching back the second mask layer so that a third top surface of the second mask layer in the first opening and a fourth top surface of the second mask layer in the second opening are below a top surface of the dielectric layer, wherein the third top surface is lower than the fourth top surface by a second distance less than the first distance.

10. The method of claim 9, wherein a pattern density of first features in the first region is greater than a pattern density of second features in the second region.

11. The method of claim 9, wherein the first mask layer, as deposited, extends higher in the first region than in the second region by a third distance.

12. The method of claim 11, wherein the second mask layer, as deposited, extends higher in the first region than in the second region by a fourth distance less than the third distance.

13. The method of claim 9 wherein the first distance is greater than 10 nm, and wherein the second distance is less than 10 nm.

14. The method of claim 9 further comprising:
depositing a third mask layer over the first mask layer in the first opening and the second opening; and
etching back the third mask layer so that a fifth top surface of the third mask layer in the first opening and a sixth top surface of the third mask layer in the second opening are below a top surface of the dielectric layer, and wherein the fifth top surface is lower than the sixth top surface by a fifth distance less than the second distance.

15. The method of claim 9 further comprising:
after etching back the second mask layer, widening upper portions of the first opening and the second opening;
after widening the upper portions of the first opening and the second opening, removing the first mask layer and the second mask layer;
forming a first contact in the first opening; and
forming a second contact in the second opening.

16. The method of claim 15 further comprising:
depositing an adhesion layer over and along sidewalls of the first opening and the second opening, wherein the first mask layer is deposited over the adhesion layer;
before widening the upper portions of the first opening and the second opening, removing portions of the adhesion layer over the second mask layer; and after removing the first mask layer and the second mask layer, depositing an additional material of the adhesion layer on sidewalls of the first opening and the second opening.

17. The method of claim 16, wherein removing the portions of the adhesion layer comprises:
etching a portion of the adhesion layer in the first opening below the third top surface; and
etching a portion of the adhesion layer in the second opening below the fourth top surface.

18. A method comprising:
etching a first opening through a dielectric layer to expose a first source/drain region of a first transistor, the first transistor is in a first region of device;
etching a second opening through the dielectric layer to expose a second source/drain region of a second transistor, the second transistor is in a second region of the device, wherein transistors in the first region are more closely spaced together than transistors in the second region;
depositing a first mask material in the first opening and the second opening;
etching the first mask material below a top surface of the dielectric layer, the first mask material has a first top surface in the first region and a second top surface in the second region, the first top surface is disposed a first height below the second top surface;
depositing a second mask material in the first opening and the second opening over the first mask material; and
etching the second mask material below a top surface of the dielectric layer, the second mask material has a third top surface in the first region and a fourth top surface in the second region, the third top surface is disposed a second height below the fourth top surface, and the first height is greater than the second height.

19. The method of claim 18 further comprising widening a top portion of the first opening and a top portion of the second opening while the first mask material and the second mask material are disposed in the first opening and the second opening.

20. The method of claim 19 further comprising:
after widening the top portion of the first opening and the top portion of the second opening, removing the first mask material and the second mask material from the first opening and the second opening; and
forming a first source/drain contact in the first opening; and
forming a second source/drain contact in the second opening.

* * * * *